(12) United States Patent
Ito

(10) Patent No.: US 12,482,968 B2
(45) Date of Patent: Nov. 25, 2025

(54) CONNECTOR DEVICE, CIRCUIT BOARD, CIRCUIT BOARD UNIT, AND ELECTRONIC APPARATUS

(71) Applicant: SEIKO EPSON CORPORATION, Tokyo (JP)

(72) Inventor: Masaaki Ito, Ina (JP)

(73) Assignee: SEIKO EPSON CORPORATION, Tokyo (JP)

( * ) Notice: Subject to any disclaimer, the term of this patent is extended or adjusted under 35 U.S.C. 154(b) by 402 days.

(21) Appl. No.: 17/868,974

(22) Filed: Jul. 20, 2022

(65) Prior Publication Data

US 2023/0025789 A1 Jan. 26, 2023

(30) Foreign Application Priority Data

Jul. 20, 2021 (JP) .................................. 2021-119838

(51) Int. Cl.
| | |
|---|---|
| *H01R 12/71* | (2011.01) |
| *H01R 4/28* | (2006.01) |
| *H01R 12/73* | (2011.01) |
| *H01R 13/502* | (2006.01) |
| *H01R 13/6585* | (2011.01) |

(52) U.S. Cl.
CPC ............ *H01R 12/716* (2013.01); *H01R 4/28* (2013.01); *H01R 12/73* (2013.01); *H01R 13/502* (2013.01); *H01R 13/6585* (2013.01)

(58) Field of Classification Search
CPC ........ H01R 12/716; H01R 4/28; H01R 12/73; H01R 13/502; H01R 13/6585; H01R 13/6596
See application file for complete search history.

(56) References Cited

U.S. PATENT DOCUMENTS

| | | | |
|---|---|---|---|
| 5,413,491 A | 5/1995 | Noschese | |
| 5,813,871 A * | 9/1998 | Grabbe ................. | H01R 12/00 439/607.07 |
| 10,361,519 B2 * | 7/2019 | Chuang ................. | H01R 13/41 |

(Continued)

FOREIGN PATENT DOCUMENTS

| | | |
|---|---|---|
| JP | H07-014580 U | 3/1995 |
| JP | H08-321358 A | 12/1996 |

(Continued)

*Primary Examiner* — Renee S Luebke
*Assistant Examiner* — Paul D Baillargeon
(74) *Attorney, Agent, or Firm* — Dority & Manning, P.A.

(57) ABSTRACT

A connector device includes a housing, a plurality of first couplers each of which has a first coupling part electrically coupled to a first counterpart coupler of a counterpart connector device, a plurality of second couplers each of which has a second coupling part electrically coupled to a second counterpart coupler of the counterpart connector device, and a ground member electrically coupled to a counterpart ground member of the counterpart connector device. The first coupling parts are arranged side by side so as to be exposed from the housing along a first surface. The second coupling parts are arranged side by side so as to be exposed from the housing along a second surface. The ground member is arranged between the first couplers and the second couplers, and is arranged along a coupling direction in which the connector device and the counterpart connector device are coupled to each other.

20 Claims, 12 Drawing Sheets

(56) References Cited

U.S. PATENT DOCUMENTS

| | | |
|---|---|---|
| 2001/0027036 A1 | 10/2001 | Goto |
| 2015/0050842 A1 | 2/2015 | Miki et al. |
| 2016/0359276 A1 | 12/2016 | Miki et al. |
| 2018/0183189 A1 | 6/2018 | Chuang |
| 2021/0119384 A1 | 4/2021 | Kawasaki |

FOREIGN PATENT DOCUMENTS

| | | |
|---|---|---|
| JP | 2000-231964 A | 8/2000 |
| JP | 2001-273949 A | 10/2001 |
| JP | 2007-141587 A | 6/2007 |
| JP | 2008-257968 A | 10/2008 |
| JP | 2015-038831 A | 2/2015 |
| JP | 2017-117734 A | 6/2017 |
| JP | 2021-068537 A | 4/2021 |

* cited by examiner

CONNECTOR DEVICE, CIRCUIT BOARD, CIRCUIT BOARD UNIT, AND ELECTRONIC APPARATUS

The present application is based on, and claims priority from JP Application Serial Number 2021-119838, filed Jul. 20, 2021, the disclosure of which is hereby incorporated by reference herein in its entirety.

BACKGROUND

1. Technical Field

The present disclosure relates to a connector device, a circuit board, a circuit board unit, and an electronic apparatus.

2. Related Art

There has been known such an electric connector for coupling circuit boards to each other as described in, for example, JP-A-2001-273949.

In such an electric connector as described above, an unwanted radiation noise (an electromagnetic noise) is apt to occur when a signal such as a high-frequency signal flows from one of the circuit boards to the other of the circuit boards, and it is required to make it possible to suppress the unwanted radiation noise. In contrast, there is known a countermeasure that, for example, a shield plate for covering the electric connector is disposed to suppress the unwanted radiation noise. In order to suppress the unwanted radiation noise using the shield plate, it is necessary to couple the shield plate to the ground provided to the circuit board. However, there is a problem that the electric connector acts as an obstacle to make it difficult to sufficiently provide a coupling area between the shield plate and the ground, and thus, it is unachievable to sufficiently suppress the unwanted radiation noise even when the shield plate is disposed.

SUMMARY

A connector device according to the present disclosure is electrically coupled to a counterpart connector device, and includes a housing, a plurality of first couplers held by the housing, each first coupler having a first coupling part to electrically be coupled to a first counterpart coupler provided to the counterpart connector device, and a plurality of second couplers held by the housing, each second coupler having a second coupling part to electrically be coupled to a second counterpart coupler provided to the counterpart connector device, and a ground member held by the housing electrically coupled to a counterpart ground member provided to the counterpart connector device. The first coupling parts of the plurality of first couplers are arranged side by side so as to be exposed from the housing along a first surface. The second coupling parts of the plurality of second couplers are arranged side by side so as to be exposed from the housing along a second surface different from the first surface. The ground member is arranged between the plurality of first couplers and the plurality of second couplers, and is arranged along a coupling direction in which the connector device and the counterpart connector device are coupled to each other.

A circuit board according to an aspect of the present disclosure includes the connector device described above, and a circuit board main body on which the connector device is arranged.

A circuit board unit according to the present disclosure includes a first circuit board main body having a first ground layer, a second circuit board main body having a second ground layer, and a connector structure configured to couple the first circuit board main body and the second circuit board main body to each other, the connector structure being configured to relay signal transmission between the first circuit board main body and the second circuit board main body. The connector structure includes a connector device arranged on the first circuit board main body, and a counterpart connector device arranged on the second circuit board main body and coupled to the connector device. The connector device includes a housing, a plurality of first couplers held by the housing, each first coupler having a first coupling part, a plurality of second couplers held by the housing, each second coupler having a second coupling part, and a ground member held by the housing. The first coupling parts of the plurality of first couplers are arranged side by side so as to be exposed from the housing along a first surface. The second coupling parts of the plurality of second couplers are arranged side by side so as to be exposed from the housing along a second surface different from the first surface. The counterpart connector device includes a counterpart housing, a plurality of first counterpart couplers held by the counterpart housing, each first counterpart coupler having a first counterpart coupling part electrically coupled to the first coupling part, a plurality of second counterpart couplers held by the counterpart housing, each second counterpart coupler having a second counterpart coupling part electrically coupled to the second coupling part, and a counterpart ground member held by the counterpart housing and electrically coupled to the ground member. The first counterpart coupling parts of the plurality of first counterpart couplers are arranged side by side so as to be exposed from the housing along a third surface. The second counterpart coupling parts of the plurality of second counterpart couplers are arranged side by side so as to be exposed from the housing along a fourth surface different from the third surface. The ground member is electrically coupled to the first ground layer, is arranged between the plurality of first couplers and the plurality of second couplers, and is arranged along a coupling direction in which the connector device and the counterpart connector device are coupled to each other. The counterpart ground member is electrically coupled to the second ground layer, is arranged between the plurality of first counterpart couplers and the plurality of second counterpart couplers, and is arranged along the coupling direction.

An electronic apparatus according to the present disclosure includes the circuit board described above.

An electronic apparatus according to the present disclosure includes the circuit board unit described above.

DESCRIPTION OF EXEMPLARY EMBODIMENTS

Figure 1:
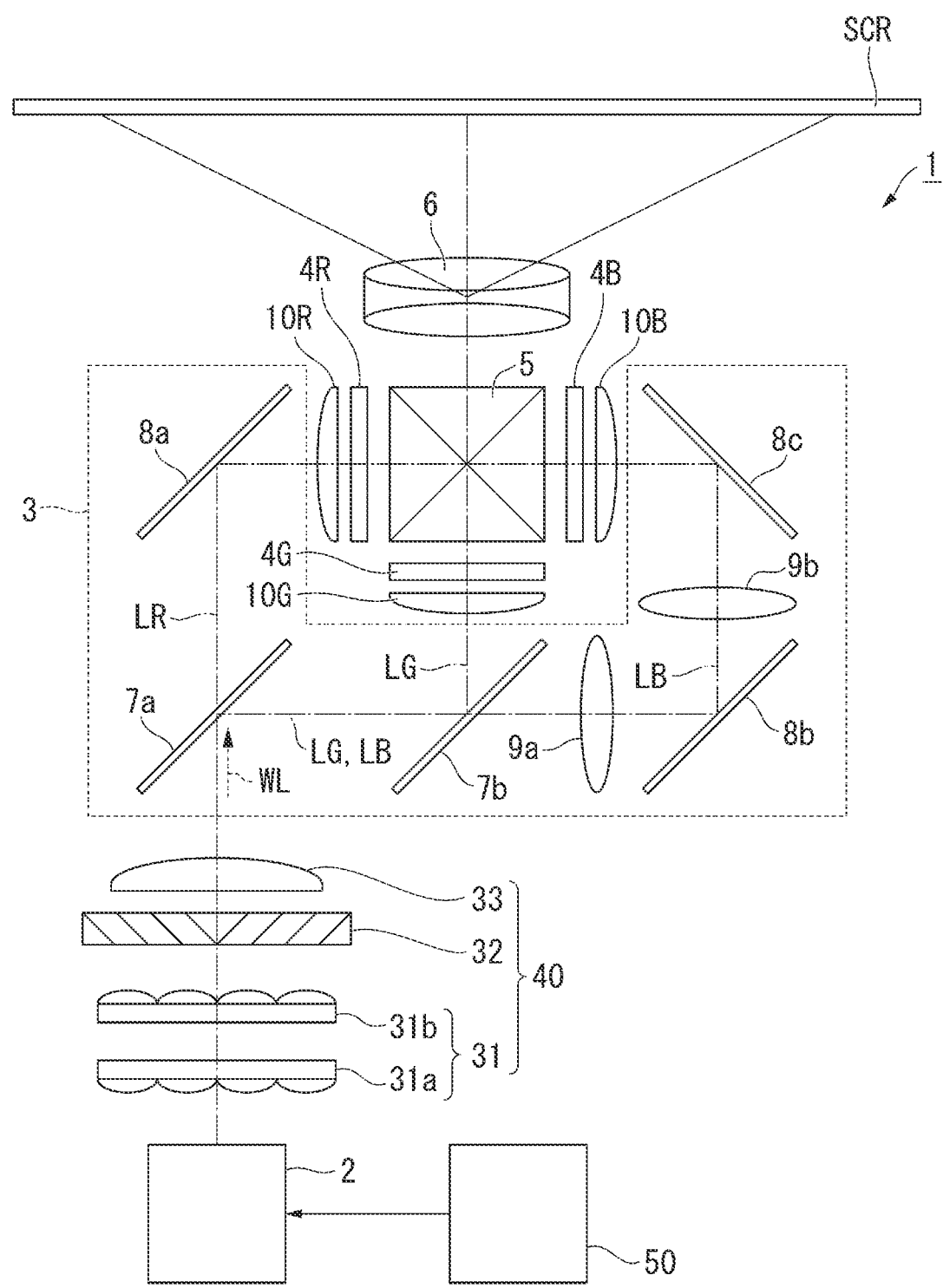
FIG. 1 is a schematic configuration diagram showing an electronic apparatus (a projector) according to a first embodiment.

Some embodiments of the present disclosure will hereinafter be described with reference to the drawings. In the following embodiments, there is provided a description citing a projector as an example of an electronic apparatus.

It should be noted that the scope of the present disclosure is not limited to the embodiments hereinafter described, but can arbitrarily be modified within the technical idea or the technical concept of the present disclosure. Further, in the drawings described below, the actual structures and the structures of the drawings are made different from each other in scale size, number, and so on of each of the constituents in some cases in order to make the constituents easy to understand.

First Embodiment

FIG. 1 is a schematic configuration diagram showing the projector (the electronic apparatus) 1 according to the present embodiment.

The projector 1 according to the present embodiment is a projection-type image display device for projecting a color image on a screen SCR. As shown in FIG. 1, the projector 1 is provided with a light source device 2, a homogeneous illumination optical system 40, a color separation optical system 3, a light modulation device 4R, a light modulation device 4G, a light modulation device 4B, a combining optical system 5, a projection optical device 6, and a control device 50. The light source device 2 emits illumination light WL toward the homogeneous illumination optical system 40.

The homogeneous illumination optical system 40 is provided with an integrator optical system 31, a polarization conversion element 32, and a superimposing optical system 33. The integrator optical system 31 is provided with a first lens array 31a and a second lens array 31b. The homogenous illumination optical system 40 homogenizes the intensity distribution of the illumination light WL emitted from the light source device 2 in each of the light modulation device 4R, the light modulation device 4G, and the light modulation device 4B as illumination target areas. The illumination light WL having been emitted from the homogeneous illumination optical system 40 enters the color separation optical system 3.

The color separation optical system 3 separates the illumination light WL having a white color into red light LR, green light LG, and blue light LB. The color separation optical system 3 is provided with a first dichroic mirror 7a, a second dichroic mirror 7b, a first reflecting mirror 8a, a second reflecting mirror 8b, a third reflecting mirror 8c, a first relay lens 9a, and a second relay lens 9b.

The first dichroic mirror 7a separates the illumination light WL from the light source device 2 into the red light LR and the other light (the green light LG and the blue light LB). The first dichroic mirror 7a transmits the red light LR thus separated from, and at the same time reflects the other light (the green light LG and the blue light LB). Meanwhile, the second dichroic mirror 7b separates the other light into the green light LG and the blue light LB. The second dichroic mirror 7b reflects the green light LG thus separated from, and transmits the blue light LB.

The first reflecting mirror 8a is disposed in a light path of the red light LR, and the red light LR which has been transmitted through the first dichroic mirror 7a is reflected by the first reflecting mirror 8a toward the light modulation device 4R. Meanwhile, the second reflecting mirror 8b and the third reflecting mirror 8c are disposed in the light path of the blue light LB, and the blue light LB which has been transmitted through the second dichroic mirror 7b is reflected by the second reflecting mirror 8b and the third reflecting mirror 8c toward the light modulation device 4B. Further, the green light LG is reflected by the second dichroic mirror 7b toward the light modulation device 4G.

The first relay lens 9a and the second relay lens 9b are disposed at the light exit side of the second dichroic mirror 7b in the light path of the blue light LB. The first relay lens 9a and the second relay lens 9b correct a difference in illuminance distribution of the blue light LB due to the fact that the blue light LB is longer in optical path length than the red light LR and the green light LG.

The light modulation device 4R modulates the red light LR in accordance with image information to form image light corresponding to the red light LR. The light modulation device 4G modulates the green light LG in accordance with the image information to form image light corresponding to the green light LG. The light modulation device 4B modulates the blue light LB in accordance with the image information to form image light corresponding to the blue light LB.

As the light modulation device 4R, the light modulation device 4G, and the light modulation device 4B, there are used, for example, transmissive liquid crystal panels. Further, at the incident side and the exit side of the liquid crystal panel, there are disposed polarization plates (not shown), respectively, and thus, there is formed a configuration of transmitting only the linearly polarized light with a specific direction.

At the incident side of the light modulation device 4R, the light modulation device 4G, and the light modulation device 4B, there are disposed a field lens 10R, a field lens 10G, and a field lens 10B, respectively. The field lens 10R, the field lens 10G, and the field lens 10B collimate principal rays of the red light LR, the green light LG, and the blue light LB which enter the light modulation device 4R, the light modulation device 4G, and the light modulation device 4B, respectively.

The combining optical system 5 combines the image light corresponding to the red light LR, the image light corresponding to the green light LG, and the image light corresponding to the blue light LB with each other in response to incidence of the image light respectively emitted from the light modulation device 4R, the light modulation device 4G, and the light modulation device 4B, and then emits the image light thus combined toward the projection optical device 6. As the combining optical system 5, there is used, for example, a cross dichroic prism.

The projection optical device 6 is constituted by a plurality of projection lenses. The projection optical device 6 projects the image light having been synthesized by the combining optical system 5 toward the screen SCR in an enlarged manner. Thus, an image is displayed on the screen SCR.

Then, the control device 50 will be described.

Figure 2:
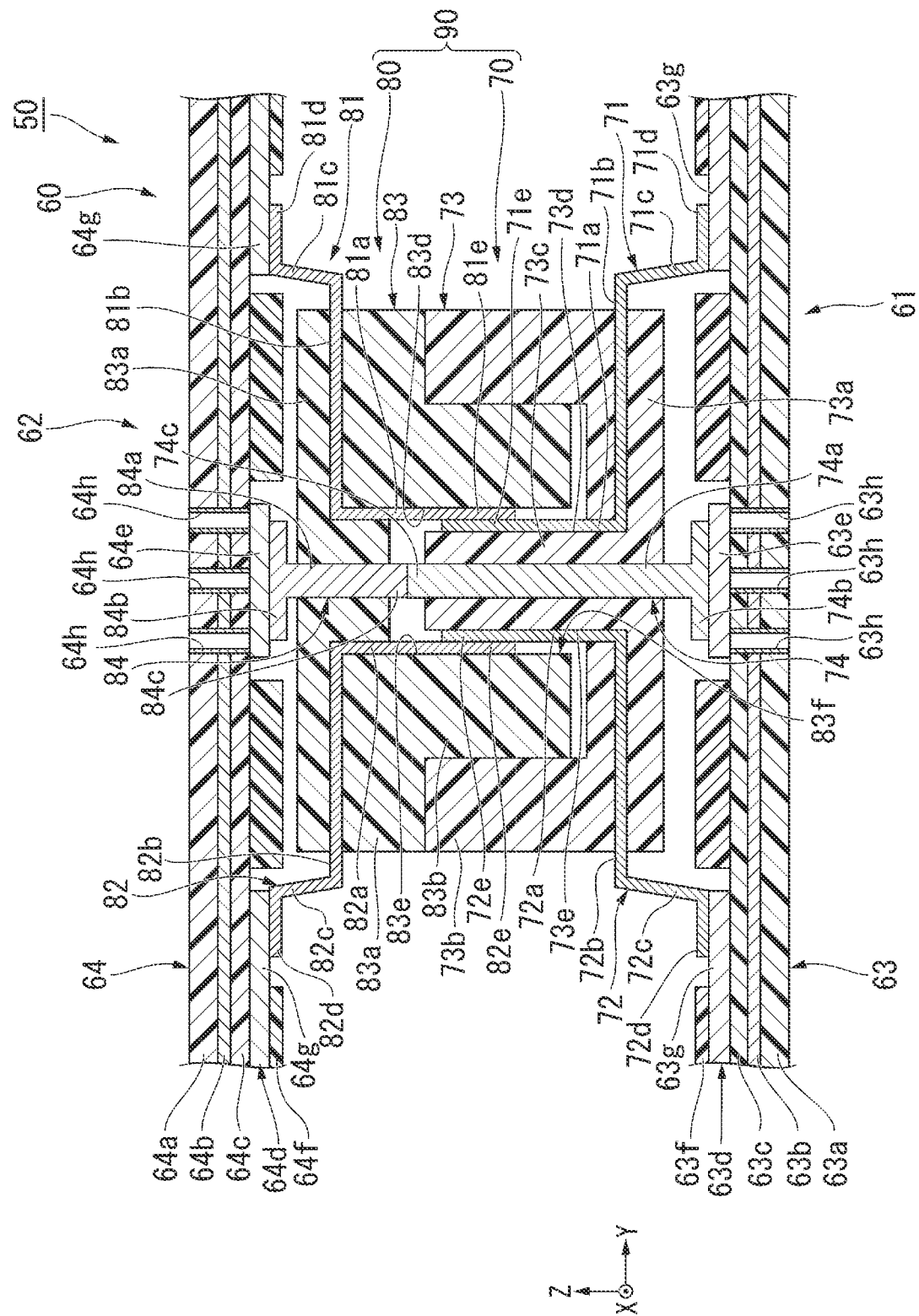
FIG. 2 is a cross-sectional view showing a part of a circuit board unit in the first embodiment.
Figure 3:
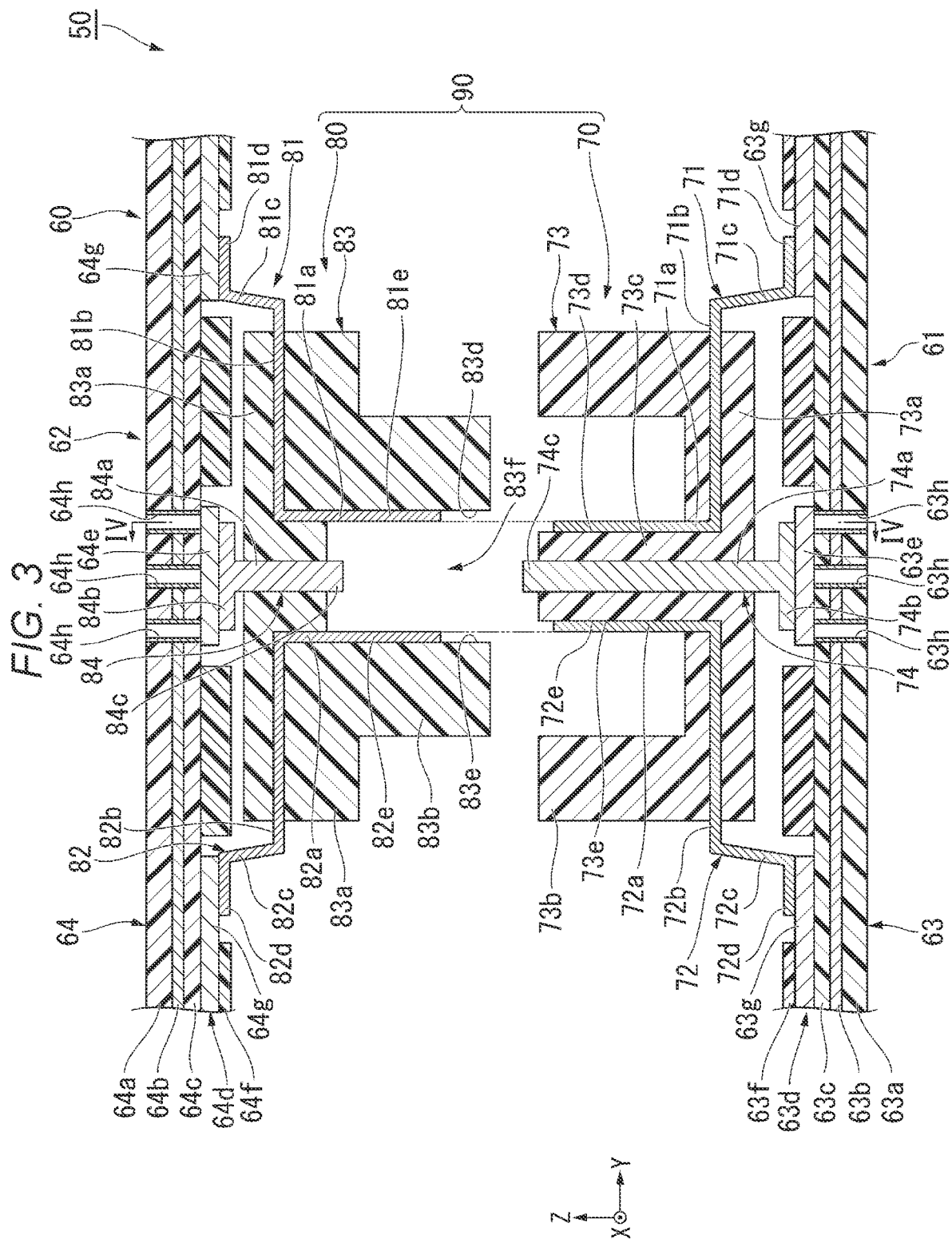
FIG. 3 is a cross-sectional view showing a part of the circuit board unit in the first embodiment, and is a diagram showing a state in which coupling between a first circuit board and a second circuit board is released.
Figure 4:
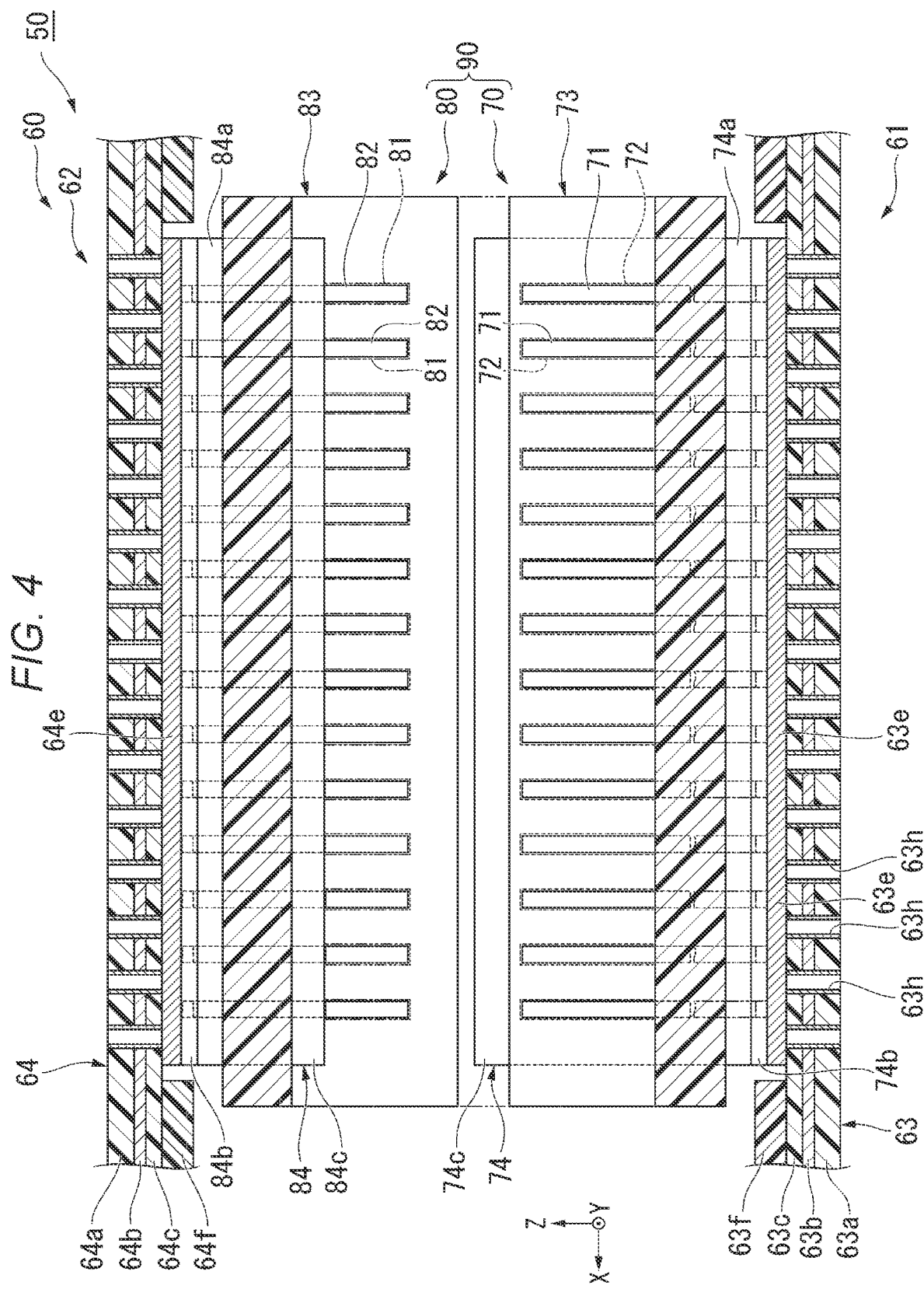
FIG. 4 is a cross-sectional view showing a part of the circuit board unit in the first embodiment, and is a cross-sectional view along a line IV-IV in FIG. 3.
Figure 5:
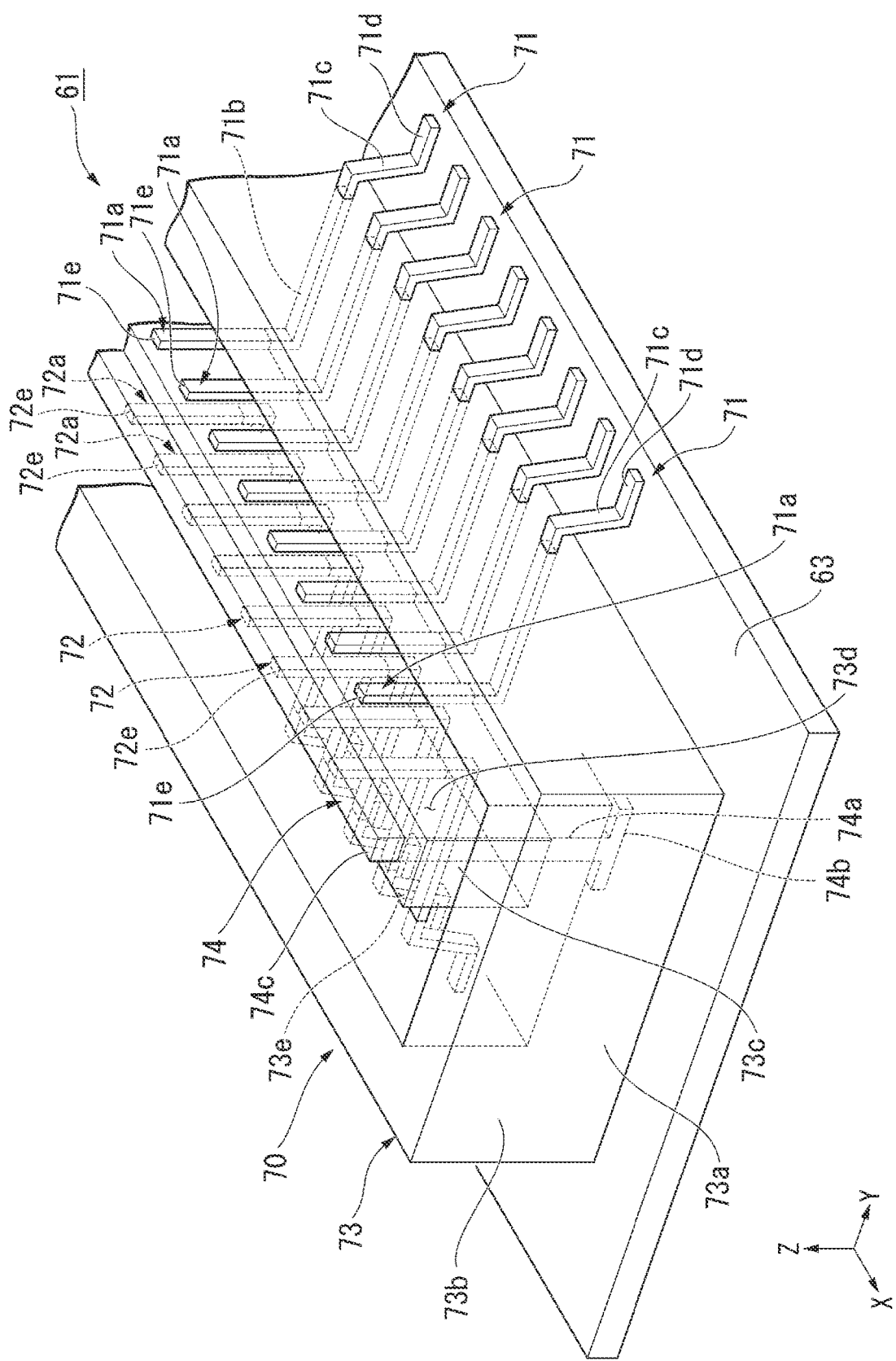
FIG. 5 is a perspective view showing a part of the first circuit board in the first embodiment.
Figure 6:
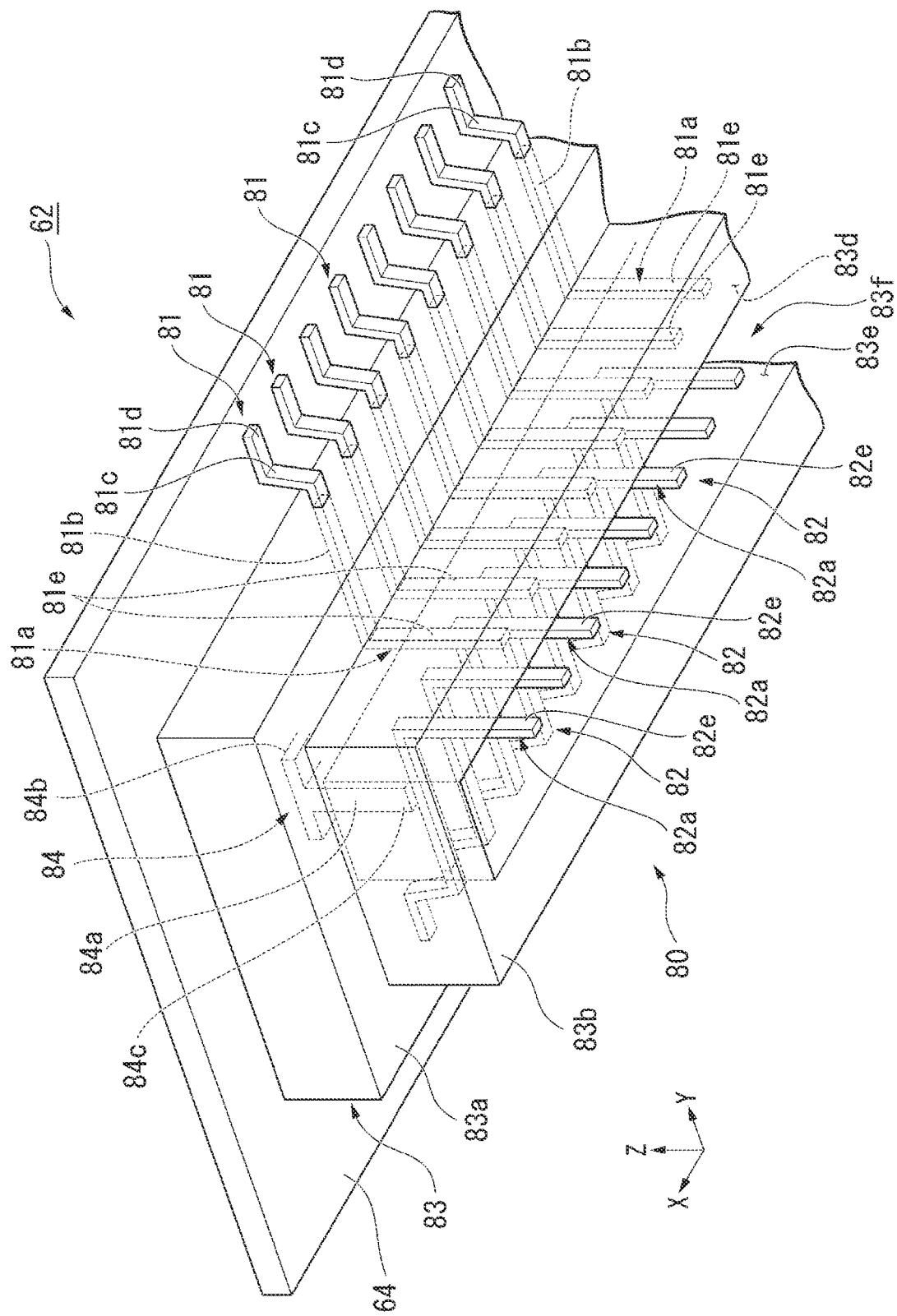
FIG. 6 is a perspective view showing a part of the second circuit board in the first embodiment.

FIG. 2 is a cross-sectional view showing a part of a circuit board unit 60 in the control device 50. FIG. 3 is a cross-sectional view showing a part of the circuit board unit 60, and is a diagram showing a state in which coupling between a first circuit board 61 and a second circuit board 62 is released. FIG. 4 is a cross-sectional view showing a part of the circuit board unit 60, and is a cross-sectional view along a line IV-IV in FIG. 3. FIG. 5 is a perspective view showing a part of the first circuit board 61. FIG. 6 is a perspective view showing a part of the second circuit board 62.

In each of the drawings, there are arbitrarily shown an X axis, a Y axis, and a Z axis. A direction parallel to the X axis is referred to as a "first horizontal direction (an arrangement direction) X," a direction parallel to the Y axis is referred to as a "second horizontal direction Y," and a direction parallel to the Z axis is referred to as a "vertical direction (a coupling direction) Z." The first horizontal direction X, the second horizontal direction Y, and the vertical direction Z are directions perpendicular to each other. A side (+Z side) to which an arrow of the Z axis points in the vertical direction Z is called an "upper side," and a side (−Z side) opposite to the side to which the arrow of the Z axis points in the vertical direction Z is called a "lower side." A side (+X side) to which an arrow of the X axis points in the first horizontal direction X is called "one side in the first horizontal direction," and a side (−X side) opposite to the side to which the arrow of the X axis points in the first horizontal direction X is called "the other side in the first horizontal direction." A side (+Y side) to which an arrow of the Y axis points in the second horizontal direction Y is called "one side in the second horizontal direction," and a side (−Y side) opposite to the side to which the arrow of the Y axis points in the second horizontal direction Y is called "the other side in the second horizontal direction."

It should be noted that the vertical direction z, the first horizontal direction X, and the second horizontal direction Y are mere names for describing a relative positional relationship between the constituents and so on, and the actual arrangement relationship and so on can be different the arrangement relationship and so on represented by these names.

The control device 50 is a main board for controlling each section of the projector 1 including the light source device 2. As shown in FIG. 2 through FIG. 4, the control device 50 has the circuit board unit 60. The circuit board unit 60 has the first circuit board (circuit board) 61 and the second circuit board (circuit board) 62. The first circuit board 61 and the second circuit board 62 are electrically coupled to each other via a connector structure 90. The first circuit board 61 and the second circuit board 62 are coupled to each other in the vertical direction Z. The second circuit board 62 is located above the first circuit board 61.

The first circuit board 61 has a first circuit board main body 63, and a connector device 70 provided to the first circuit board main body 63. The second circuit board 62 has a second circuit board main body 64, and a counterpart connector device 80 provided to the second circuit board main body 64. The connector device 70 and the counterpart connector device 80 constitute the connector structure 90 for coupling the first circuit board main body 63 and the second circuit board main body 64 to each other. The connector structure 90 relays signal transmission between the connector device 70, the first circuit board main body 63 and the second circuit board main body 64. The connector structure 90 has the connector device 70 and the counterpart connector device 80.

The connector device 70 is attached to an upper surface of the first circuit board main body 63. The counterpart connector device 80 is attached to a lower surface of the second circuit board main body 64. The connector device 70 and the counterpart connector device 80 are coupled to each other in the vertical direction Z. In other words, in the present embodiment, a coupling direction in which the connector device 70 and the counterpart connector device 80 are coupled to each other is the vertical direction Z.

As shown in FIG. 2, the first circuit board main body 63 and the second circuit board main body 64 are each shaped like a plate having a plate surface facing to the vertical direction 2. In the present embodiment, the first circuit board main body 63 and the second circuit board main body 64 are each a printed circuit board provided with wiring patterns formed of copper foil. The first circuit board main body 63 and the second circuit board main body 64 are boards having structures of the same type, and are arranged so as to be flipped in the vertical direction z from each other. In the following description, regarding the configuration substantially the same as that of the first circuit board main body 63 except the point that the configuration is flipped in the vertical direction Z, the description of the second circuit board main body 64 is partially omitted in some cases.

The first circuit board main body 63 has an insulating layer 63a, a first ground layer 63b, an insulating layer 63c, a wiring layer 63d, and a resist layer 63f. The insulating layer 63a, the first ground layer 63b, the insulating layer 63c, the wiring layer 63d, and the resist layer 63f are stacked on one another in this order from the lower side toward the upper side. A lower surface of the insulating layer 63a constitutes a lower surface of the first circuit board main body 63. An upper surface of the resist layer 63f constitutes an upper surface of the first circuit board main body 63. The upper surface of the first circuit board main body 63 is a mounting surface to be attached with an electronic element and so on. The first ground layer 63b is a layer the potential of which is set to a reference potential in the circuit board unit 60. The first ground layer 63b is constituted by, for example, a solid pattern made of copper foil. The first ground layer 63b is also called a reference plane.

The wiring layer 63d is constituted by a plurality of wiring patterns formed of copper foil. The wiring layer 63d has a ground pad part 63e and a plurality of wiring pad parts 63g. An upper surface of the wiring layer 63d is covered with the resist layer 63f except the ground pad part 63e and the plurality of wiring pad parts 63g. The ground pad part 63e and the plurality of wiring pad parts 63g are exposed at an upper side of the first circuit board main body 63. In the present embodiment, the plurality of wiring pad parts 63g includes a pair of wiring pad parts 63g which sandwich the ground pad part 63e in the second horizontal direction Y. Although the illustration is omitted, there is disposed a plurality of pairs of wiring pad parts 63g at intervals in the first horizontal direction X.

As shown in FIG. 4, the ground pad part 63e extends in the first horizontal direction X. The ground pad part 63e is electrically coupled to the first ground layer 63b via through holes 63h. The through holes 63h penetrate the insulating layer 63a, the first ground layer 63b, and the insulating layer 63c in the vertical direction Z. An upper end portion of each of the through holes 63h is coupled to a lower surface of the ground pad part 63e. Copper foil is disposed on an inner circumferential surface of each of the through holes 63h. The copper foil disposed on the inner circumferential surface of each of the through holes 63h electrically couples the first ground layer 63b and the ground pad part 63e to each other. There is disposed a plurality of the through holes 63h. The plurality of through holes 63h includes the plurality of through holes 63h arranged along the first horizontal direction X. Further, as shown in FIG. 2 and FIG. 3, the plurality of through holes 63h includes the plurality of through holes 63h arranged along the second horizontal direction Y.

The second circuit board main body 64 has an insulating layer 64a, a second ground layer 64b, an insulating layer 64c, a wiring layer 64d, and a resist layer 64f. The insulating layer 64a, the second ground layer 64b, the insulating layer 64c, the wiring layer 64d, and the resist layer 64f are stacked on one another in this order from the upper side toward the lower side. An upper surface of the insulating layer 64a constitutes an upper surface of the second circuit board main body 64. A lower surface of the resist layer 64f constitutes a lower surface of the second circuit board main body 64. The lower surface of the second circuit board main body 64 is a mounting surface to be attached with an electronic element and so on. The second ground layer 64b is a layer the potential of which is set to the reference potential in the circuit board unit 60. The second ground layer 64b is constituted by, for example, a solid pattern made of copper foil. The second ground layer 64b is also called a reference plane. The wiring layer 64d has a ground pad part 64e and a plurality of wiring pad parts 64g. The ground pad part 64e is electrically coupled to the second ground layer 64b via a plurality of through holes 64h.

In the present embodiment, the connector device 70 is an external connector, and the counterpart connector device 80 is an internal connector. The connector device 70 and the counterpart connector device 80 are fitted in each other in the vertical direction Z to electrically be coupled to each other. In other words, in the present embodiment, a fitting direction between the connector device 70 and the counterpart connector device 80 is the vertical direction Z.

The connector device 70 has a housing 73, a plurality of first couplers 71, a plurality of second couplers 72, and a ground member 74. The housing 73 is a member made of resin for holding the plurality of first couplers 71, the plurality of second couplers 72, and the ground member 74. The housing 73 is manufactured by, for example, insert molding taking the plurality of first couplers 71, the plurality of second couplers 72, and the ground member 74 as insert members. As shown in FIG. 5, the housing 73 is shaped like a substantially rectangular solid box opening upward. The housing 73 has a bottom wall part 73a constituting a wall part at a lower side, a circumferential wall part 73b protruding upward from the outer circumferential edge portion of the bottom wall part 73a, and a protruding part 73c protruding upward from the bottom wall part 73a at an inner side of the circumferential wall part 73b. The circumferential wall part 73b is shaped like a rectangular frame elongated in the first horizontal direction X. The protruding part 73c is shaped like a rectangular solid extending in the first horizontal direction X. An outer circumferential surface of the protruding part 73c is arranged at a distance from the inner circumferential surface of the circumferential wall part 73b throughout the entire circumference. As shown in FIG. 2 and FIG. 3, the housing 73 is arranged upward at a distance from the upper surface of the first circuit board main body 63 via a gap.

The plurality of first couplers 71 is held by the housing 73. A part of each of the first couplers 71 is embedded in the housing 73. As shown in FIG. 5, the first couplers 71 are each an elongated plate-like member made of metal. The plurality of first couplers 71 is arranged side by side at intervals along the first horizontal direction X. The first couplers 71 each include a first extending part 71a, a second extending part 71b, a third extending part 71c, and a pad coupling part 71d.

The first extending part 71a extends in the vertical direction Z. A lower end portion of the first extending part 71a is embedded in the bottom wall part 73a. In the first extending part 71a, a portion at the upper side of the lower end portion corresponds to a first coupling part 71e to electrically be coupled to a first counterpart coupling part 81e described later. The first coupling part 71e projects upward from the bottom wall part 73a, and is exposed from the housing 73. The first coupling part 71e is located at one side (+Y side) in the second horizontal direction with respect to the protruding part 73c out of an inner side of the circumferential wall part 73b. An upper end portion of the first coupling part 71e is located at a lower side of the upper end portion of the circumferential wall part 73b and the upper end portion of the protruding part 73c. The first coupling part 71e has contact with a side surface (a first surface) 73d located at one side in the second horizontal direction out of side surfaces of the protruding part 73c. Specifically, the first coupling parts 71e of the plurality of first couplers 71 are exposed from the housing 73 along the side surface 73d. The side surface 73d is a flat surface which faces to the one side in the second horizontal direction Y, and is perpendicular to the second horizontal direction Y. In the present embodiment, the side surface 73d corresponds to the "first surface." The first coupling parts 71e of the plurality of first couplers 71 are arranged side by side at intervals in the first horizontal direction X along the side surface 73d.

The second extending part 71b extends from a lower end portion of the first extending part 71a toward the one side (+Y side) in the second horizontal direction. An end portion at the one side in the second horizontal direction of the second extending part 71b projects from the side surface of the housing 73 toward the one side in the second horizontal direction, and is exposed from the housing 73. A portion of the second extending part 71b except the end portion at the one side in the second horizontal direction is embedded in the bottom wall part 73a.

The third extending part 71c extends from an end portion at the one side (+Y side) in the second horizontal direction of the second extending part 71b downward and obliquely toward the one side in the second horizontal direction. As shown in FIG. 2 and FIG. 3, a lower end portion of the third extending part 71c is located below the housing 73. The pad coupling part 71d extends from the lower end portion of the third extending part 71c toward the one side in the second horizontal direction. The pad coupling part 71d is electrically coupled to one of the wiring pad parts 63g located at the one side in the second horizontal direction of the ground pad part 63e out of the plurality of wiring pad parts 63g. Thus, the first couplers 71 are electrically coupled to the first circuit board main body 63. The pad coupling part 71d is coupled to the wiring pad part 63g with, for example, soldering.

The plurality of second couplers 72 is held by the housing 73. A part of each of the second couplers 72 is embedded in the housing 73. As shown in FIG. 5, the second couplers 72 are each an elongated plate-like member made of metal. The plurality of second couplers 72 is arranged side by side at intervals along the first horizontal direction X. The second couplers 72 are each arranged at a position where the protruding part 73c is sandwiched between the second coupler 72 and corresponding one of the first couplers 71 in the second horizontal direction Y. The second couplers 72 are each a member having substantially the same shape as that of the first coupler 71. The first couplers 71 and the second couplers 72 are arranged symmetrically to each other in the second horizontal direction Y across the protruding part 73c.

As shown in FIG. 2 and FIG. 3, the second couplers 72 each include a first extending part 72a, a second extending part 72b, a third extending part 72c, and a pad coupling part 72d. The parts of the second coupler 72 have substantially the same shapes as those of the respective parts having substantially the same names in the first coupler 71 except the point that those are symmetric with respect to the second horizontal direction Y.

In the first extending part 72a, a portion at the upper side of the lower end portion corresponds to a second coupling part 72e to electrically be coupled to a second counterpart coupling part 82e described later. The second coupling part 72e projects upward from the bottom wall part 73a, and is exposed from the housing 73. The second coupling part 72e is located at the other side (−Y side) in the second horizontal direction with respect to the protruding part 73c out of the inner side of the circumferential wall part 73b. An upper end portion of the second coupling part 72e is located at a lower side of the upper end portion of the circumferential wall part 73b and the upper end portion of the protruding part 73c. The upper end portion of the second coupling part 72e is arranged at the same position as the upper end portion of the first coupling part 71e in the vertical direction Z.

The second coupling part 72e has contact with a side surface (a second surface) 73e located at the other side (−Y side) in the second horizontal direction out of the side surfaces of the protruding part 73c. Specifically, the second coupling parts 72e of the plurality of second couplers 72 are exposed from the housing 73 along the side surface 73e. The side surface 73e is a flat surface which faces to the other side in the second horizontal direction, and is perpendicular to the second horizontal direction Y. In the present embodiment, the side surface 73e corresponds to a "second surface" different from the side surface 73d as the first surface. As shown in FIG. 5, the second coupling parts 72e of the plurality of second couplers 72 are arranged side by side at intervals in the first horizontal direction X along the side surface 73e. In other words, in the present embodiment, an arrangement direction of the plurality of first coupling parts 71e and an arrangement direction of the plurality of second coupling parts 72e are the first horizontal direction X, namely the same as each other. In the present embodiment, the second coupling parts 72e are each arranged at a position where the protruding part 73c is sandwiched between the second coupling part 72e and corresponding one of the first coupling part 71e in the second horizontal direction Y.

As shown in FIG. 2 and FIG. 3, the pad coupling part 72d is electrically coupled to one of the wiring pad parts 63g located at the other side (−Y side) in the second horizontal direction of the ground pad part 63e out of the plurality of wiring pad parts 63g. Thus, the second couplers 72 are electrically coupled to the first circuit board main body 63. The pad coupling part 72d is coupled to the wiring pad part 63g with, for example, soldering.

The ground member 74 is held by the housing 73. In the present embodiment, the ground member 74 is held by the protruding part 73c. A part of the ground member 74 is embedded in the housing 73. The ground member 74 is made of metal. In the present embodiment, the ground member 74 is a plate-like member. The ground member 74 is arranged between the plurality of first couplers 71 and the plurality of second couplers 72 in the second horizontal direction Y, and at the same time, arranged along a coupling direction between the connector device 70 and the counterpart connector device 80, namely the vertical direction Z. The ground member 74 extends in the vertical direction Z. The ground member 74 extends upward from the first circuit board main body 63, and protrudes above the first couplers 71, the second couplers 72, and the housing 73.

As shown in FIG. 4, the ground member 74 extends along the first horizontal direction X, namely the arrangement direction of the first coupling parts 71e and the second coupling parts 72e. An end portion at the one side (+X side) in the first horizontal direction of the ground member 74 is located at the one side in the first horizontal direction of the plurality of first couplers 71 and the plurality of second couplers 72. An end portion at the other side (−X side) in the first horizontal direction of the ground member 74 is located at the other side in the first horizontal direction of the plurality of first couplers 71 and the plurality of second couplers 72. As described above, the ground member 74 is disposed up to the outer side in the first horizontal direction X with respect to both of the first couplers 71 respectively disposed at the both ends in the first horizontal direction X and the second couplers 72 respectively disposed at the both ends in the first horizontal direction X. It should be noted that it is sufficient for the ground member 74 to be disposed up to the outer side in the first horizontal direction X with respect to at least one of four couplers, namely the first coupler 71 disposed in the end portion at the one side (+X side) in the first horizontal direction, the first coupler 71 disposed in the end portion at the other side (−X side) in the first horizontal direction, the second coupler 72 disposed in the end portion at the one side (+X side) in the first horizontal direction, and the second coupler 72 disposed in the end portion at the other side (−X side) in the first horizontal direction.

The ground member 74 has a main body part 74a, and a board coupling part 74b connecting to the main body part 74a. The main body part 74a is shaped like a rectangular plate elongated in the first horizontal direction X and having a plate surface facing to the second horizontal direction Y. As shown in FIG. 2 and FIG. 3, the main body part 74a penetrates the bottom wall part 73a and the protruding part 73c in the vertical direction Z. Both end portions in the vertical direction Z of the main body part 74a project in the vertical direction Z from the housing 73. An upper end portion of the main body part 74a corresponds to a ground coupling part 74c to electrically be coupled to a counterpart ground member 84 described later. The ground coupling part 74c projects upward from an upper surface of the protruding part 73c, and is exposed from the housing 73. The ground coupling part 74c projects upward from the housing 73 in a coupling direction in which the connector device 70 and the counterpart connector device 80 are coupled to each other, namely the vertical direction Z.

The main body part 74a is located between the first extending part 71a of the first coupler 71 and the first extending part 72a of the second coupler 72 in the second horizontal direction Y. In the present embodiment, the first extending part 71a is a portion the closest to the ground member 74 out of the first coupler 71. In the present embodiment, the first extending part 72a is a portion the closest to the ground member 74 out of the second coupler 72. A distance along the second horizontal direction Y between the main body part 74a and the first extending part 71a, and a distance along the second horizontal direction Y between the main body part 74a and the first extending part 72a are, for example, no larger than 300 µm. Between the main body part 74a and the first extending part 71a in the second horizontal direction Y, and between the main body part 74a and the first extending part 72a in the second horizontal direction Y, there intervenes resin constituting a part of the protruding part 73c.

The board coupling part 74b connects to a lower end portion of the main body part 74a. The board coupling part 74b projects downward from the housing 73. Specifically, the board coupling part 74b projects from the housing 73 in the coupling direction (the vertical direction Z) in which the connector device 70 and the counterpart connector device 80 are coupled to each other. The whole of the board coupling part 74b is located outside the housing 73.

As shown in FIG. 5, the board coupling part 74b extends in the first horizontal direction X. The board coupling part 74b is shaped like a rectangular plate elongated in the first horizontal direction X and having a plate surface facing to the vertical direction z. The board coupling part 74b protrudes from the main body part 74a in the second horizontal direction Y. In the present embodiment, the second horizontal direction Y is a direction crossing the coupling direction (the vertical direction z) in which the connector device 70 and the counterpart connector device 80 are coupled to each other, and at the same time, a direction different from the arrangement direction (the first horizontal direction X) of the plurality of first coupling parts 71e and the arrangement direction (the first horizontal direction X) of the plurality of second coupling parts 72e. In the present embodiment, the board coupling part 74b protrudes from the main body part 74a toward the both sides in the second horizontal direction Y.

As shown in FIG. 2 and FIG. 3, the board coupling part 74b is electrically coupled to the ground pad part 63e from above. Thus, the board coupling part 74b is electrically coupled to the first circuit board main body 63 to which the connector device 70 is attached. The board coupling part 74b is coupled to the ground pad part 63e with, for example, soldering. The board coupling part 74b is electrically coupled to the first ground layer 63b via the ground pad part 63e and the through holes 63h. Thus, the ground member 74 is electrically coupled to the first ground layer 63b via the ground pad part 63e and the through holes 63h.

The counterpart connector device 80 has a counterpart housing 83, a plurality of first counterpart couplers 81, a plurality of second counterpart couplers 82, and a counterpart ground member 84. The counterpart housing 83 is a member made of resin for holding the plurality of first counterpart couplers 81, the plurality of second counterpart couplers 82, and the counterpart ground member 84. The counterpart housing 83 is manufactured by, for example, insert molding taking the plurality of first counterpart couplers 81, the plurality of second counterpart couplers 82, and the counterpart ground member 84 as insert members.

As shown in FIG. 6, the counterpart housing 83 is shaped like a substantially rectangular solid box opening downward. The counterpart housing 83 has a top wall part 83a constituting an upper wall part, and a circumferential wall part 83b protruding downward from a central portion of the top wall part 83a. The circumferential wall part 83b is shaped like a rectangular frame elongated in the first horizontal direction X. An outer circumferential edge portion of the circumferential wall part 83b is located at a distance from the outer circumferential edge portion of the top wall part 83a toward the inside thereof. The top wall part 83a and the circumferential wall part 83b form a recessed part 83f recessed upward. The recessed part 83f opens downward. As shown in FIG. 2 and FIG. 3, the counterpart housing 83 is arranged downward at a distance from the lower surface of the second circuit board main body 64 via a gap.

As shown in FIG. 2, the counterpart housing 83 is fitted in the housing 73 in the vertical direction Z. In the present embodiment, the circumferential wall part 83b of the counterpart housing 83 is fitted in the inside of the circumferential wall part 73b of the housing 73 from above. A lower end portion of the circumferential wall part 83b is arranged above the bottom wall part 73a of the housing 73 so as to be opposed thereto via a gap. A portion located at an outer side of the circumferential wall part 83b out of the top wall part 83a of the counterpart housing 83 has contact with an upper end portion of the circumferential wall part 73b of the housing 73. Inside the circumferential wall part 83b of the counterpart housing 83, namely inside the recessed part 83f, there is inserted the protruding part 73c. An upper end portion of the protruding part 73c is located downward at a distance from the bottom portion of the recessed part 83f.

The plurality of first counterpart couplers 81 is held by the counterpart housing 83. A part of each of the first counterpart couplers 81 is embedded in the counterpart housing 83. As shown in FIG. 6, the first counterpart couplers 81 are each an elongated plate-like member made of metal. The plurality of first counterpart couplers 81 is arranged side by side at intervals along the first horizontal direction X. The first counterpart couplers 81 are each a member having substantially the same shape as that of the first coupler 71. The first counterpart couplers 81 are each arranged in a posture flipped in the vertical direction Z with respect to the first coupler 71. The first counterpart couplers 81 each include a first extending part 81a, a second extending part 81b, a third extending part 81c, and a pad coupling part 81d.

The first extending part 81a extends in the vertical direction Z. An upper end portion of the first extending part 81a is embedded in the top wall part 83a. In the first extending part 81a, a portion at the lower side of the upper end portion corresponds to a first counterpart coupling part 81e to electrically be coupled to the first coupling part 71e. The first counterpart coupling part 81e projects downward from the top wall part 83a, and is exposed from the counterpart housing 83. The first counterpart coupling part 81e is located inside the circumferential wall part 83b, namely in the recessed part 83f. A lower end portion of the first counterpart coupling part 81e is located at an upper side of the lower end portion of the circumferential wall part 83b. The first counterpart coupling part 81e has contact with an inner side surface (a third surface) 83d located at the one side (+Y side) in the second horizontal direction out of the inner side surfaces of the circumferential wall part 83b, namely the inner side surfaces of the recessed part 83f. Specifically, the first counterpart coupling parts 81e of the plurality of first counterpart couplers 81 are exposed from the counterpart housing 83 along the inner side surface 83d. The inner side surface 83d is a flat surface which faces to the other side (−Y side) in the second horizontal direction, and is perpendicular to the second horizontal direction Y. In the present embodiment, the inner side surface 83d corresponds to the "third surface."

The first counterpart coupling parts 81e of the plurality of first counterpart couplers 81 are arranged side by side at intervals in the first horizontal direction X along the inner side surface 83d. As shown in FIG. 2, in the state in which the housing 73 and the counterpart housing 83 are fitted in each other, the lower portion of the first counterpart coupling part 81e has contact with the upper portion of the first coupling part 71e in the connector device 70 from the one side (+Y side) in the second horizontal direction. Thus, the first coupler 71 and the first counterpart coupler 81 are electrically coupled to each other.

The second extending part 81b extends from an upper end portion of the first extending part 81a toward the one side (+Y side) in the second horizontal direction. An end portion at the one side in the second horizontal direction of the second extending part 81b projects from the side surface of the counterpart housing 83 toward the one side in the second horizontal direction, and is exposed from the counterpart housing 83. A portion of the second extending part 81b except the end portion at the one side in the second horizontal direction is embedded in the top wall part 83a.

The third extending part 81c extends from an end portion at the one side (+Y side) in the second horizontal direction of the second extending part 81b upward and obliquely toward the one side in the second horizontal direction. An upper end portion of the third extending part 81c is located above the counterpart housing 83. The pad coupling part 81d extends from the upper end portion of the third extending part 81c toward the one side in the second horizontal direction. The pad coupling part 81d is electrically coupled to one of the wiring pad parts 64g located at the one side in the second horizontal direction of the ground pad part 64e out of the plurality of wiring pad parts 64g. Thus, the first counterpart couplers 81 are electrically coupled to the second circuit board main body 64. The pad coupling part 81d is coupled to the wiring pad part 64g with, for example, soldering.

The plurality of second counterpart couplers 82 is held by the counterpart housing 83. A part of each of the second counterpart couplers 82 is embedded in the counterpart housing 83. As shown in FIG. 6, the second counterpart couplers 82 are each an elongated plate-like member made of metal. The plurality of second counterpart couplers 82 is arranged side by side at intervals along the first horizontal direction X. Each of the second counterpart couplers 82 is arranged at a position where the second counterpart coupler 82 is opposed to corresponding one of the first counterpart couplers 81 at a distance at the other side (−Y side) in the second horizontal direction. The second counterpart couplers 82 are each a member having substantially the same shape as that of the first counterpart coupler 81. The first counterpart couplers 81 and the second counterpart couplers 82 are arranged symmetrically to each other in the second horizontal direction Y.

As shown in FIG. 2 and FIG. 3, the second counterpart couplers 82 each include a first extending part 82a, a second extending part 82b, a third extending part 82c, and a pad coupling part 82d. The parts of the second counterpart coupler 82 have substantially the same shapes as those of the respective parts having substantially the same names in the first counterpart coupler 81 except the point that those are symmetric with respect to the second horizontal direction Y.

In the first extending part 82a, a portion at the lower side of the upper end portion corresponds to a second counterpart coupling part 82e to electrically be coupled to the second coupling part 72e. The second counterpart coupling part 82e projects downward from the top wall part 83a, and is exposed from the counterpart housing 83. The second counterpart coupling part 82e is located inside the circumferential wall part 83b, namely inside the recessed part 83f. A lower end portion of the second counterpart coupling part 82e is located at an upper side of the lower end portion of the circumferential wall part 83b. The lower end portion of the second counterpart coupling part 82e is arranged at the same position as the lower end portion of the first counterpart coupling part 81e in the vertical direction z.

The second counterpart coupling part 82e has contact with an inner side surface (a fourth surface) 83e located at the other side (−Y side) in the second horizontal direction out of the inner side surfaces of the circumferential wall part 83b, namely the inner side surfaces of the recessed part 83f. Specifically, the second counterpart coupling parts 82e of the plurality of second counterpart couplers 82 are exposed from the counterpart housing 83 along the inner side surface 83e. The inner side surface 83e is a flat surface which faces to the one side (+Y side) in the second horizontal direction, and is perpendicular to the second horizontal direction Y. In the present embodiment, the inner side surface 83e corresponds to the "fourth surface" different from the inner side surface 83e as the third surface.

As shown in FIG. 6, the second counterpart coupling parts 82e of the plurality of second counterpart couplers 82 are arranged side by side at intervals in the first horizontal direction X along the inner side surface 83e. In other words, in the present embodiment, an arrangement direction of the plurality of first counterpart coupling parts 81e and an arrangement direction of the plurality of second counterpart coupling parts 82e are the first horizontal direction X, namely the same as each other. In the present embodiment, each of the second counterpart coupling parts 82e is arranged at a position where the second counterpart coupling part 82e is opposed to corresponding one of the first counterpart coupling parts 81e in the second horizontal direction Y in the inside of the circumferential wall part 83b, namely the inside of the recessed part 83f. As shown in FIG. 2, in the state in which the housing 73 and the counterpart housing 83 are fitted in each other, the lower portion of the second counterpart coupling part 82e has contact with the upper portion of the second coupling part 72e in the connector device 70 from the other side (−Y side) in the second horizontal direction. Thus, the second coupler 72 and the second counterpart coupler 82 are electrically coupled to each other.

The pad coupling part 82d is electrically coupled to one of the wiring pad parts 64g located at the other side (−Y side) in the second horizontal direction of the ground pad part 64e out of the plurality of wiring pad parts 64g. Thus, the second counterpart couplers 82 are electrically coupled to the second circuit board main body 64. The pad coupling part 82d is coupled to the wiring pad part 64g with, for example, soldering.

The counterpart ground member 84 is held by the counterpart housing 83. In the present embodiment, the counterpart ground member 84 is held by a portion located at an inner side of the circumferential wall part 83b out of the top wall part 83a. In other words, the counterpart ground member 84 is held by a bottom portion of the recessed part 83f. A part of the counterpart ground member 84 is embedded in the counterpart housing 83. The counterpart ground member 84 is made of metal. In the present embodiment, the counterpart ground member 84 is a plate-like member. The counterpart ground member 84 is arranged between the plurality of first counterpart couplers 81 and the plurality of second counterpart couplers 82 in the second horizontal direction Y, and at the same time, arranged along a coupling direction between the connector device 70 and the counterpart connector device 80, namely the vertical direction Z. The counterpart ground member 84 extends in the vertical direction Z. The counterpart ground member 84 extends downward from the second circuit board main body 64, penetrates the top wall part 83a, and projects in the recessed part 83f.

As shown in FIG. 4, the counterpart ground member 84 extends along the first horizontal direction X, namely the arrangement direction of the first counterpart coupling parts 81e and the second counterpart coupling parts 82e. An end portion at the one side (+X side) in the first horizontal direction of the counterpart ground member 84 is located at the one side in the first horizontal direction of the plurality of first counterpart couplers 81 and the plurality of second counterpart couplers 82. An end portion at the other side (−X side) in the first horizontal direction of the counterpart ground member 84 is located at the other side in the first horizontal direction of the plurality of first counterpart couplers 81 and the plurality of second counterpart couplers 82. As described above, the counterpart ground member 84 is disposed up to the outer side in the first horizontal direction X with respect to both of the first counterpart couplers 81 respectively disposed at the both ends in the first horizontal direction X and the second counterpart couplers 82 respectively disposed at the both ends in the first horizontal direction X. It should be noted that it is sufficient similarly for the counterpart ground member 84 to be disposed up to the outer side in the first horizontal direction X with respect to at least one of four couplers, namely the two first counterpart couplers 81 respectively disposed in the end portion at the one side (+X side) in the first horizontal direction and the end portion at the other side (−X side) in the first horizontal direction, and the two second counterpart couplers 82 respectively disposed in the end portion at the one side (+X side) in the first horizontal direction and the end portion at the other side (−X side) in the first horizontal direction.

The counterpart ground member 84 has a counterpart main body part 84a, a counterpart board coupling part 84b connecting to the counterpart main body part 84a, and a counterpart ground coupling part 84c. The counterpart main body part 84a is shaped like a rectangular plate elongated in the first horizontal direction X and having a plate surface facing to the second horizontal direction Y. As shown in FIG. 2 and FIG. 3, an upper end portion of the counterpart main body part 84a projects upward from the counterpart housing 83. A lower end portion of the counterpart main body part 84a corresponds to the counterpart ground coupling part 84c to electrically be coupled to the ground coupling part 74c of the ground member 74. The counterpart ground coupling part 84c projects downward from the top wall part 83a, and is exposed from the counterpart housing 83. The counterpart ground coupling part 84c is exposed inside the circumferential wall part 83b, namely inside the recessed part 83f. The counterpart ground coupling part 84c projects downward from the bottom portion of the recessed part 83f. In other words, the counterpart ground coupling part 84c projects downward from the counterpart housing 83 in the coupling direction in which the connector device 70 and the counterpart connector device 80 are coupled to each other. The counterpart ground coupling part 84c is located at an upper side of the lower end portion of the first counterpart coupler 81 and the lower end portion of the second counterpart coupler 82, namely at a back side (+Z side) in the recessed part 83f.

A lower portion of the counterpart main body part 84a is located between the first extending part 81a of the first counterpart coupler 81 and the first extending part 82a of the second counterpart coupler 82 in the second horizontal direction Y. In the present embodiment, the first extending part 81a is a portion the closest to the counterpart ground member 84 out of the first counterpart coupler 81. In the present embodiment, the first extending part 82a is a portion the closest to the counterpart ground member 84 out of the second counterpart coupler 82. A distance along the second horizontal direction Y between the counterpart main body part 84a and the first extending part 81a, and a distance along the second horizontal direction Y between the counterpart main body part 84a and the first extending part 82a are, for example, no larger than 300 µm. Between the counterpart main body part 84a and the first extending part 81a in the second horizontal direction Y, and between the counterpart main body part 84a and the first extending part 82a in the second horizontal direction Y, there intervenes resin constituting a part of the top wall part 83a or an air gap.

The counterpart board coupling part 84b connects to an upper end portion of the counterpart main body part 84a. The counterpart board coupling part 84b projects upward from the counterpart housing 83. Specifically, the counterpart board coupling part 84b projects from the counterpart housing 83 in the coupling direction (the vertical direction Z) in which the connector device 70 and the counterpart connector device 80 are coupled to each other. The whole of the counterpart board coupling part 84b is located outside the counterpart housing 83.

As shown in FIG. 6, the counterpart board coupling part 84b extends in the first horizontal direction X. The counterpart board coupling part 84b is shaped like a rectangular plate elongated in the first horizontal direction X and having a plate surface facing to the vertical direction Z. The counterpart board coupling part 84b protrudes from the counterpart main body part 84a in the second horizontal direction Y. In the present embodiment, the second horizontal direction Y is a direction crossing the coupling direction (the vertical direction z) in which the connector device 70 and the counterpart connector device 80 are coupled to each other, and at the same time, a direction different from the arrangement direction (the first horizontal direction X) of the plurality of first counterpart coupling parts 81e and the arrangement direction (the first horizontal direction X) of the plurality of second counterpart coupling parts 82e. In the present embodiment, the counterpart board coupling part 84b protrudes from the counterpart main body part 84a toward the both sides in the second horizontal direction Y.

As shown in FIG. 2 and FIG. 3, the counterpart board coupling part 84b is electrically coupled to the ground pad part 64e from below. Thus, the counterpart board coupling part 84b is electrically coupled to the second circuit board main body 64 to which the counterpart connector device 80 is attached. The counterpart board coupling part 84b is coupled to the ground pad part 64e with, for example, soldering. The counterpart board coupling part 84b is electrically coupled to the second ground layer 64b via the ground pad part 64e and the through holes 64h. Thus, the counterpart ground member 84 is electrically coupled to the second ground layer 64b via the ground pad part 64e and the through holes 64h.

Figure 10:
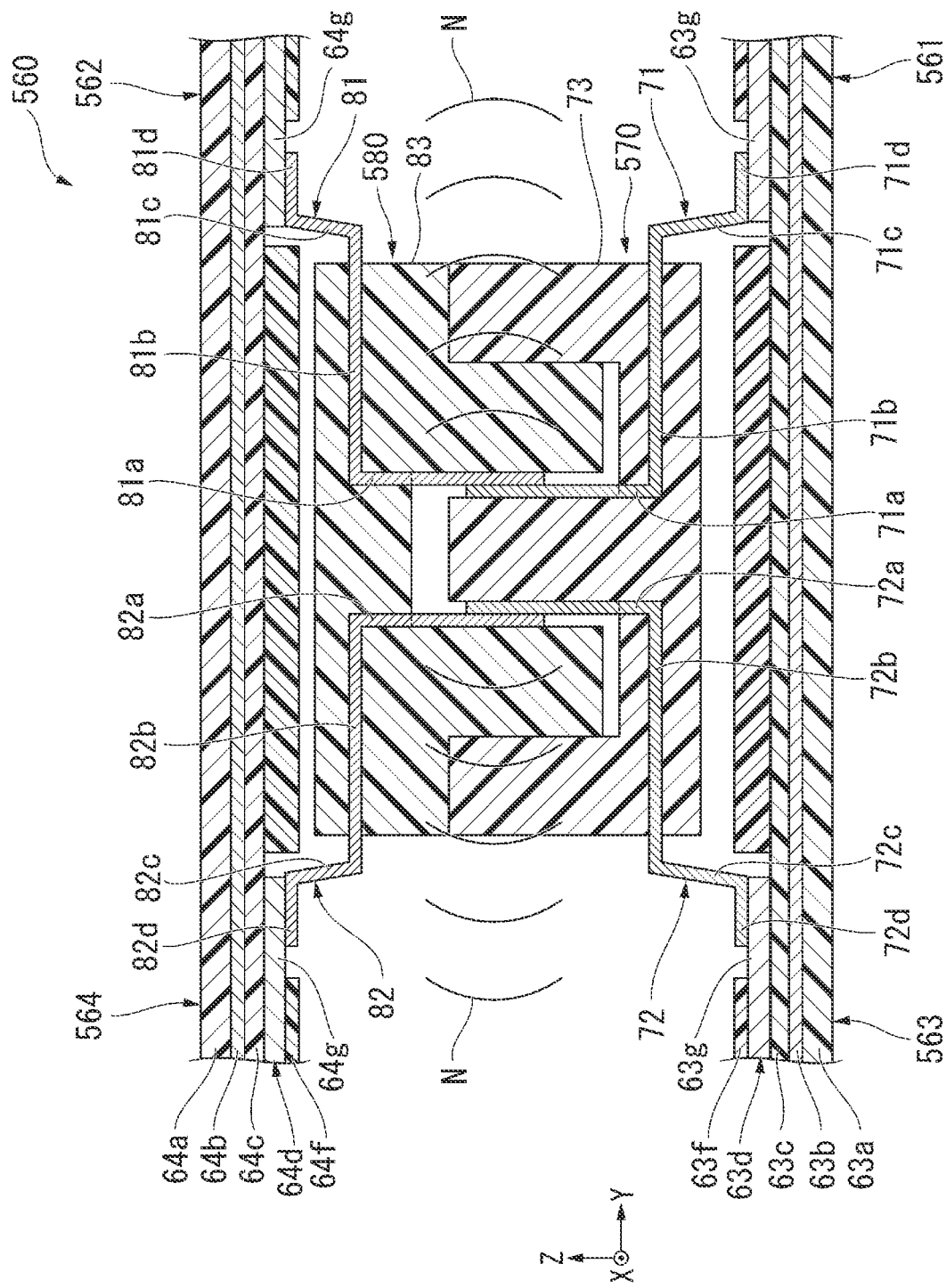
FIG. 10 is a cross-sectional view showing a part of a circuit board unit in Comparative Example 1.
Figure 11:
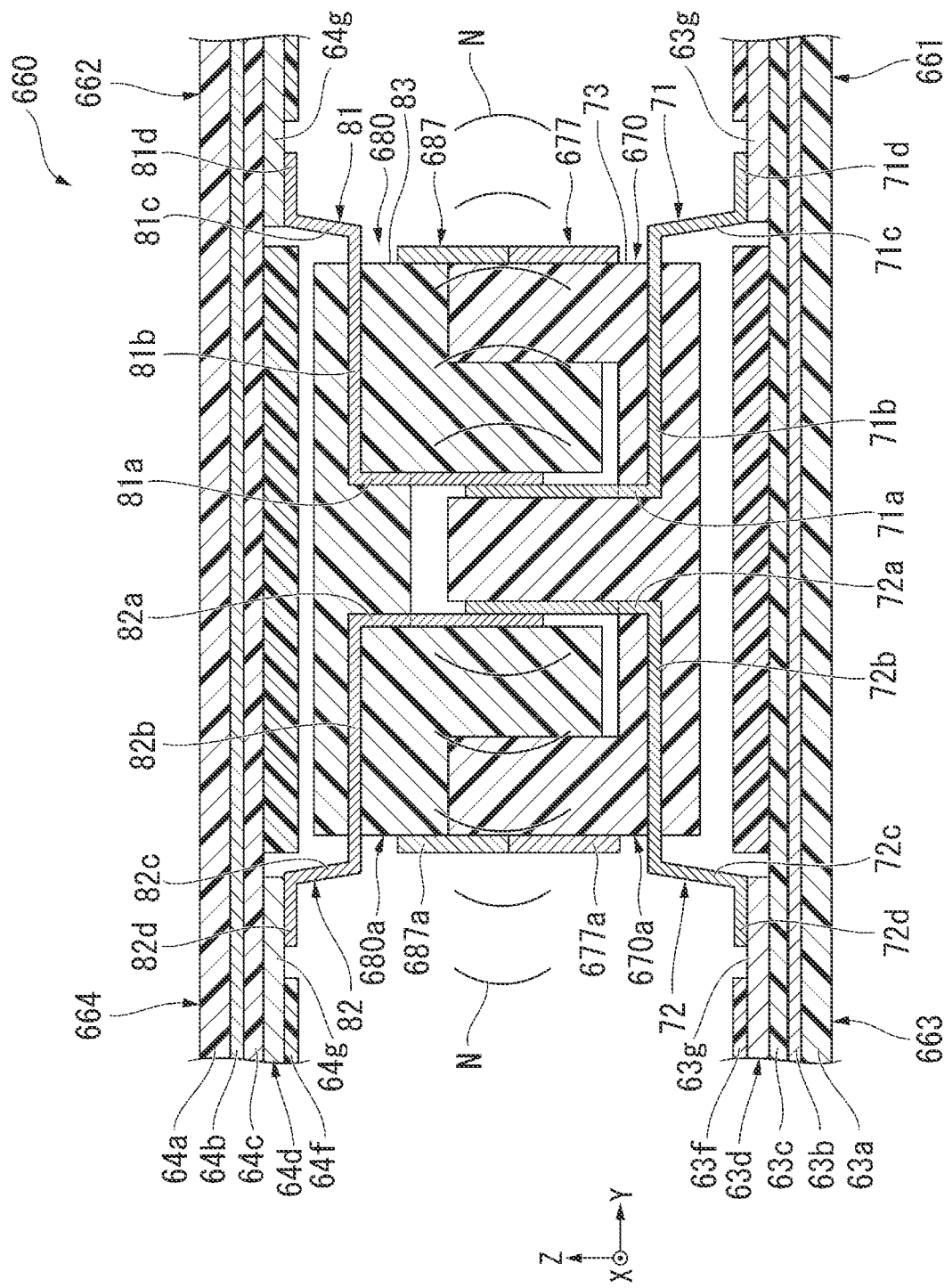
FIG. 11 is a cross-sectional view showing a part of a circuit board unit in Comparative Example 2.
Figure 12:
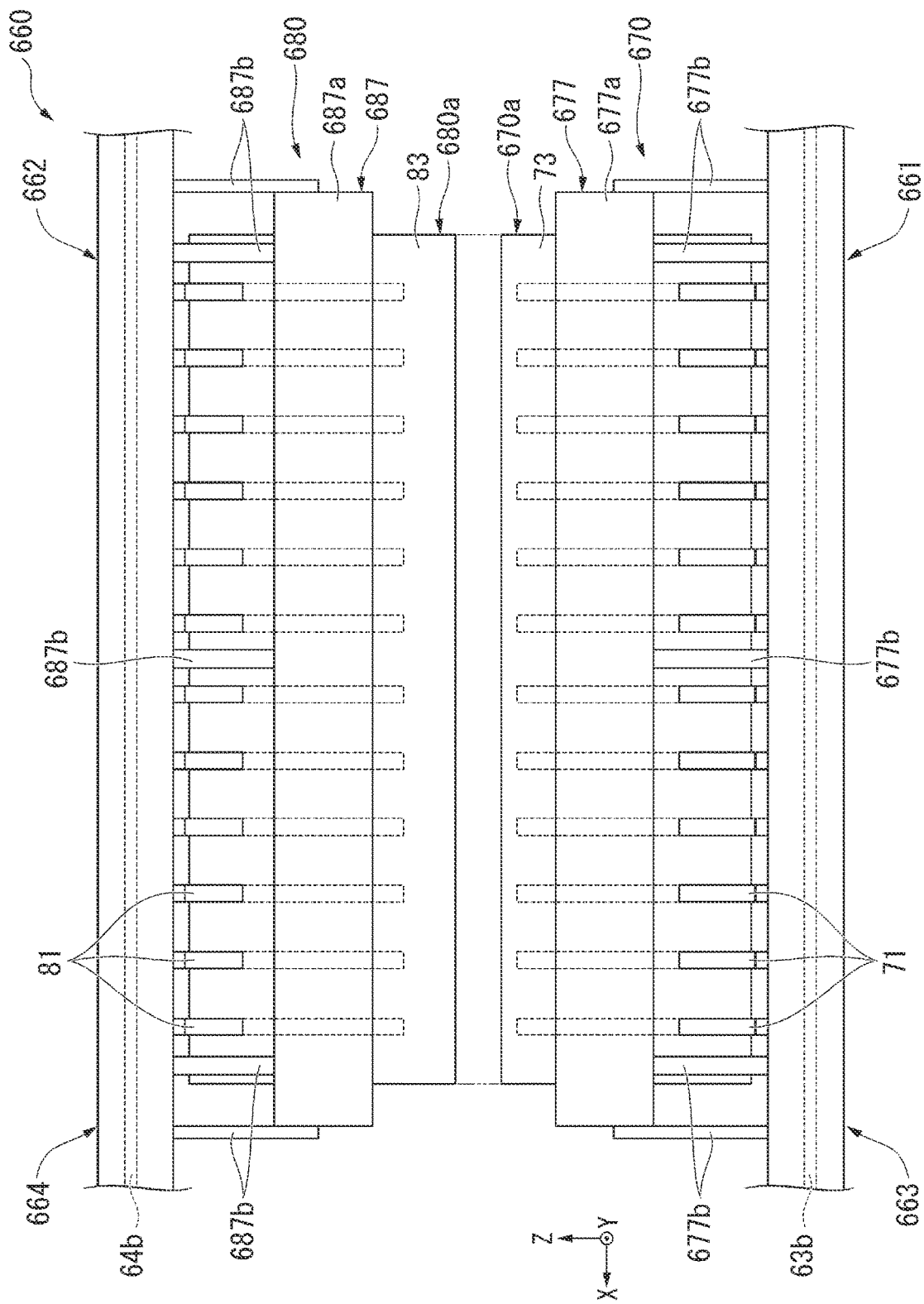
FIG. 12 is a diagram of a part of the circuit board unit in Comparative Example 2 viewed from one side in a second horizontal direction.

Then, advantages of the present embodiment will be described in comparison with Comparative Example 1 and Comparative Example 2. FIG. 10 is a cross-sectional view showing a part of a circuit board unit 560 in Comparative Example 1. FIG. 11 is a cross-sectional view showing a part of a circuit board unit 660 in Comparative Example 2. FIG. 12 is a diagram of a part of the circuit board unit 660 in Comparative Example 2 viewed from the one side (+Y side) in the second horizontal direction. Regarding Comparative Example 1, 2, the constituents substantially the same as those of the embodiment described above are arbitrarily denoted by the same reference symbols to thereby omit the description thereof in some cases.

As shown in FIG. 10, the circuit board unit 560 in Comparative Example 1 has a first circuit board 561 and a second circuit board 562. The first circuit board 561 has a first circuit board main body 563 and a connector device 570. The second circuit board 562 has a second circuit board main body 564 and a counterpart connector device 580. The first circuit board main body 563 is substantially the same in configuration as the first circuit board main body 63 described above except the point that the ground pad part 63e is not provided. The second circuit board main body 564 is substantially the same in configuration as the second circuit board main body 64 described above except the point that the ground pad part 64e is not provided. The connector device 570 is substantially the same in configuration as the connector device 70 described above except the point that the ground member 74 is not provided. The counterpart connector device 580 is substantially the same in configuration as the counterpart connector device 80 described above except the point that the counterpart ground member 84 is not provided.

In Comparative Example 1, there is considered when, for example, a current such as a high-frequency current flowing through the wiring layer 63d of the first circuit board main body 563 flows to the second circuit board main body 64 via the first coupler 71 and the first counterpart coupler 81. The wiring layer 63d is arranged along the first ground layer 63b on the first circuit board main body 563. Therefore, when the current flows through the wiring layer 63d, the first ground layer 63b acts as a return path to make a return current in an opposite direction to a direction of the current flowing through the wiring layer 63d flow through the first ground layer 63b. Thus, an electromagnetic field generated by the current flowing through the wiring layer 63d and an electromagnetic field generated by the return current flowing through the first ground layer 63b cancel out each other, and thus, it is possible to prevent the unwanted radiation noise N caused by the current flowing through the wiring layer 63d from occurring. In other words, the energy of the current flowing through the wiring layer 63d and the energy of the return current flowing through the first ground layer 63b balance out each other, and thus, excess energy is difficult to occur, and therefore, it is prevented that the excess energy is released as the unwanted radiation noise N.

The current flowing through the wiring layer 63d flows from the wiring pad part 63g toward the first coupler 71. The current having flowed to the first coupler 71 flows from the pad coupling part 71d through the third extending part 71c, the second extending part 71b, and the first extending part 71a in this order, and then flows into the first counterpart coupler 81 coupled to the first coupler 71. The third extending part 71c, the second extending part 71b, and the first extending part 71a are separated upward from the first circuit board main body 563. Therefore, the current having flowed to the first coupler 71 gets away from the first ground layer 63b of the first circuit board main body 563 as a result. Thus, the return current stops flowing through the first ground layer 63b even when the current flows through the first coupler 71. In other words, in Comparative Example 1, the return path to the current having flowed from the wiring layer 63d to the first coupler 71 is not provided, and thus, the return current corresponding to the current flowing to the first coupler 71 fails to flow. Therefore, the electromagnetic field generated by the current flowing through the first coupler 71 is not canceled out, and thus, the unwanted radiation noise N caused by the current flowing through the first coupler 71 is released. In other words, the current flowing through the first coupler 71 becomes higher than the return current, and the energy which cannot return as the return current is released as the unwanted radiation noise N.

The current having flowed to the first counterpart coupler 81 flows from the first extending part 81a through the second extending part 81b, the third extending part 81c, and the pad coupling part 81d in this order, and then flows into the wiring layer 64d of the second circuit board main body 564 coupled to the first counterpart coupler 81. Since the first counterpart coupler 81 is arranged at a distance from the second ground layer 64b of the second circuit board main body 564 similarly to the first coupler 71, the unwanted radiation noise N caused by the current flowing through the first counterpart coupler 81 is released in substantially the same manner as described above. The unwanted radiation noise N caused by the current flowing through the wiring layer 64d of the second circuit board main body 564 is prevented from being released similarly to the unwanted radiation noise N caused by the current flowing through the wiring layer 63d of the first circuit board 563 described above.

As described hereinabove, in the circuit board unit 560 in Comparative Example 1, the ground layer which constituting the return path in the connector device 570 and the counterpart connector device 580 is segmentalized, and therefore, the return current does not flow between the circuit boards. Therefore, the unwanted radiation noise N caused by the current flowing through the first coupler 71 and the first counterpart coupler 81 is released. Further, similarly to the first coupler 71 and the first counterpart coupler 81, the unwanted radiation noise N caused by the current flowing through the second coupler 72 and the second counterpart coupler 82 is also released.

Further, unless such a reference plane as the first ground layer 63b is provided to the current flowing to the first coupler 71 and the first counterpart coupler 81, a characteristic impedance of the first coupler 71 and a characteristic impedance of the first counterpart coupler 81 change with respect to a characteristic impedance of the first ground layer 63b of the first circuit board main body 563 and a characteristic impedance of the second ground layer 64b of the second circuit board main body 564. Therefore, it becomes difficult to design the characteristic impedance of the first coupler 71 and the characteristic impedance of the first counterpart coupler 81. Thus, there is a possibility that a quality of a signal such as a high frequency signal flowing via the first coupler 71 and the first counterpart coupler 81 becomes worse. This applies to the second coupler 72 and the second counterpart coupler 82.

In the past, it has been attempted to reduce the unwanted radiation noise N by adopting such a configuration as the circuit board unit 660 in Comparative Example 2 to such a circuit board unit 560 in Comparative Example 1 as described above. As shown in FIG. 11 and FIG. 12, the circuit board unit 660 in Comparative Example 2 has a first circuit board 661 and a second circuit board 662. The first circuit board 661 has a first circuit board main body 663 and a connector device 670. The second circuit board 662 has a second circuit board main body 664 and a counterpart connector device 680. The first circuit board main body 663 is substantially the same in configuration as the first circuit board main body 563 in Comparative Example 1 except the point that there are disposed pad parts not shown to which coupling leg parts 677b described later are electrically coupled. The second circuit board main body 664 is substantially the same in configuration as the second circuit board main body 564 in Comparative Example 1 except the point that there are disposed pad parts not shown to which counterpart coupling leg parts 687b described later are electrically coupled. FIG. 12 shows a state in which the coupling between the first circuit board 661 and the second circuit board 662 is released.

The connector device 670 has a connector device main body 670a and a shield member 677. The connector device main body 670a is substantially the same in configuration as the connector device 570 in Comparative Example 1. The shield member 677 is a member made of metal and surrounding the connector device main body 670a. As shown in FIG. 12, the shield member 677 has a shield member main body 677a and a plurality of coupling leg parts 677b. The shield member main body 677a is shaped like a rectangular frame surrounding the connector device main body 670a. The shield member main body 677a is disposed at a distance upward from the first circuit board main body 663. The plurality of coupling leg parts 677b extends downward from the shield member main body 677a. Lower end portions of the plurality of coupling leg parts 677b are electrically coupled to the pad parts not shown provided to the first circuit board main body 663. The pad parts are electrically coupled to the first ground layer 63b. By the coupling leg parts 677b being coupled to the pad parts, the shield member 677 is electrically coupled to the first ground layer 63b. The number of the coupling leg parts 677b is smaller than the number of the first couplers 71 and the number of the second couplers 72.

The counterpart connector device 680 has a counterpart connector device main body 680a and a counterpart shield member 687. The counterpart connector device main body 680a is substantially the same in configuration as the counterpart connector device 580 in Comparative Example 1. The counterpart shield member 687 is a member made of metal and surrounding the counterpart connector device main body 680a. The counterpart shield member 687 has a counterpart shield member main body 687a and a plurality of counterpart coupling leg parts 687b. The counterpart shield member main body 687a is shaped like a rectangular frame surrounding the counterpart connector device main body 680a. The counterpart shield member main body 687a is disposed at a distance downward from the second circuit board main body 664. As shown in FIG. 11, the lower end portion of the counterpart shield member main body 687a is electrically coupled to an upper end portion of the shield member main body 677a. Thus, the shield member 677 and the counterpart shield member 687 are electrically coupled to each other.

As shown in FIG. 12, the plurality of counterpart coupling leg parts 687b extends upward from the counterpart shield member main body 687a. Upper end portions of the plurality of counterpart coupling leg parts 687b are electrically coupled to the pad parts not shown provided to the second circuit board main body 664. The pad parts are electrically coupled to the second ground layer 64b. By the counterpart coupling leg parts 687b being coupled to the pad parts, the counterpart shield member 687 is electrically coupled to the second ground layer 64b. The number of the counterpart coupling leg parts 687b is smaller than the number of the first counterpart couplers 81 and the number of the second counterpart couplers 82.

In Comparative Example 2, the first ground layer 63b of the first circuit board main body 663 and the second ground layer 64b of the second circuit board main body 664 are electrically coupled to each other via the shield member 677 and the counterpart shield member 687. Therefore, the shield member 677 and the counterpart shield member 687 create a path through which a current can flow between the first circuit board main body 663 and the second circuit board main body 664.

Here, coupling between the shield member 677 and the first circuit board main body 663 is required to be achieved in the periphery of the connector device 670 while avoiding the couplers to be coupled to the first circuit board main body 663 out of the connector device main body 670a. Therefore, it is unachievable to make the number of the coupling leg parts 677b which can be arranged sufficiently large with respect to the number of the couplers of the connector device main body 670a since the couplers act as obstacles. Further, coupling between the counterpart shield member 687 and the second circuit board main body 664 is required to be achieved in the periphery of the counterpart connector device 680 while avoiding the couplers to be coupled to the second circuit board main body 664 out of the counterpart connector device main body 680a. Therefore, it is unachievable to make the number of the counterpart coupling leg parts 687b which can be arranged sufficiently large with respect to the number of the couplers of the counterpart connector device main body 680a since the couplers act as obstacles. On the above grounds, although the path through which the current flows is created by the shield member 677 and the counterpart shield member 687, it is unachievable to ensure the sufficient return path for making the return current corresponding to the current flowing through the couplers flow in good condition only with that path.

Further, since there is adopted the configuration in which the connector device main body 670a is surrounded from the outside with the shield member 677, it is unachievable to arrange the shield member 677 sufficiently close to the first couplers 71 and the second couplers 72. Further, since there is adopted the configuration in which the counterpart connector device main body 680a is surrounded from the outside with the counterpart shield member 687, it is unachievable to arrange the counterpart shield member 687 sufficiently close to the first counterpart couplers 81 and the second counterpart couplers 82. On the above grounds, the return current corresponding to the current flowing through the couplers is difficult to flow through the shield member 677 and the counterpart shield member 687.

On the above grounds, even when disposing the shield member 677 and the counterpart shield member 687 as in Comparative Example 2, it is unachievable to make the return current sufficiently high with respect to the current such as a high frequency signal flowing through the first couplers 71, the second couplers 72, the first counterpart couplers 81, and the second counterpart couplers 82. Therefore, it is unachievable to sufficiently suppress the unwanted radiation noise N caused by the current flowing through the couplers. Further, the structure of the shield member 677 and the structure of the counterpart shield member 687 are apt to be complicated, and the manufacturing cost of the circuit board unit 660 is apt to increase. Further, similarly to Comparative Example 1, it becomes difficult to design the characteristic impedance of each of the couplers, and there is a possibility that the quality of the signal flowing through each of the couplers degrades.

In view of the problems described hereinabove, according to the present embodiment, the connector device 70 is provided with the housing 73, the plurality of first couplers 71 which is held by the housing 73, and has the first coupling parts 71e to electrically be coupled respectively to the first counterpart couplers 81 provided to the counterpart connector device 80, the plurality of second couplers 72 which is held by the housing 73, and has the second coupling parts 72e to electrically be coupled respectively to the second counterpart couplers 82 provided to the counterpart connector device 80, and the ground member 74 which is held by the housing 73, and is electrically be coupled to the counterpart ground member 84 provided to the counterpart connector device 80. The first coupling parts 71e of the plurality of first couplers 71 are arranged side by side so as to be exposed from the housing 73 along the side surface (the first surface) 73d. The second coupling parts 72e of the plurality of second couplers 72 are arranged side by side so as to be exposed from the housing 73 along the side surface (the second surface) 73e different from the side surface (the first surface) 73d. The ground member 74 is arranged between the plurality of first couplers 71 and the plurality of second couplers 72, and at the same time, arranged along the coupling direction (the vertical direction Z) in which the connector device 70 and the counterpart connector device 80 are coupled to each other.

Therefore, by the ground member 74 and the counterpart ground member 84 being electrically coupled to each other, it is possible to dispose the return path through which the return current flows between the first circuit board main body 63 and the second circuit board main body 64 with the ground member 74 and the counterpart ground member 84. Since the ground member 74 is arranged between the first coupler 71 and the second coupler 72, it is possible to make the ground member 74 project downward from the housing 73 to be coupled to the first circuit board main body 63 as in the present embodiment. In other words, there is no need to couple the ground member 74 to the first circuit board main body 63 while avoiding the first couplers 71 and the second couplers 72 on the periphery of the connector device 70, and there is no chance for the first couplers 71 and the second couplers 72 to act as obstacles when coupling the ground member 74 to the first circuit board main body 63. Thus, it is possible to increase the area in which the ground member 74 and the first circuit board main body 63 are coupled to each other in accordance with the number of the first couplers 71 and the number of the second couplers 72 in good condition. Specifically, in the present embodiment, since it is possible to sufficiently dispose the through holes 63h, it is possible to sufficiently electrically couple the ground member 74 and the first ground layer 63b in accordance with the number of the couplers, and thus, it is possible to sufficiently ensure the return path.

Further, since the ground member 74 is arranged between the plurality of first couplers 71 and the plurality of second couplers 72, it is easy to reduce the distance between the ground member 74 and the first couplers 71, and the distance between the ground member 74 and the second couplers 72. Thus, it is possible to make it easy to make the return current corresponding to the current flowing through the first couplers 71 and the current flowing through the second couplers 72 flow through the ground member 74. For example, by setting the distance between the ground member 74 and the first couplers 71 and the distance between the ground member 74 and the second couplers 72 to be no larger than 300 µm, it is easy to make the return current corresponding to the current flowing through the first couplers 71 and the current flowing through the second couplers 72 flow through the ground member 74 in good condition. Therefore, it is possible to make the sufficient amount of the return current flow through the return path sufficiently provided using the ground member 74 and the counterpart ground member 84. Therefore, it is possible to cancel out the electromagnetic field generated by the current flowing through the couplers with the electromagnetic field generated by the return current flowing through the ground member 74 and the counterpart ground member 84 in good condition. Thus, the unwanted radiation noise N caused by the current flowing through the couplers can be prevented from occurring in good condition. In other words, since the energy of the current flowing through the couplers and the energy of the return current are balanced out to make the excess energy difficult to occur, it is possible to suppress the unwanted radiation noise N caused by the excess energy in good condition.

Such a structure as described above is a structure in which the ground layer, which is disposed along a transmission path of a signal, such as the first ground layer 63b provided to the first circuit board main body 63 and the second ground layer 64b provided to the second circuit board main body 64 can be provided to each of the couplers using the ground member 74 and the counterpart ground member 84. A structure in which a ground layer is disposed along a transmission path of a signal is also called a microstrip structure. In other words, the structure in the present embodiment is a structure capable of performing the transmission of the signal between the first circuit board main body 63 and the second circuit board main body 64 while keeping the microstrip structure in good condition.

Further, it is possible to provide such a reference plane as the first ground layer 63b and the second ground layer 64b to each of the couplers with the ground member 74 and the counterpart ground member 84. Therefore, even when the couplers are separated from the circuit board main bodies, it is possible to provide the reference plane to each of the couplers separated from the circuit board main bodies using the ground member 74 and the counterpart ground member 84. Thus, it is possible to prevent the characteristic impedance of each of the couplers from changing with respect to the characteristic impedance of each of the wiring layers provided to the circuit boards. Therefore, it is possible to make the design of the characteristic impedance of the couplers easy, and it is possible to prevent the quality of the signal flowing through the couplers from becoming worse.

Further, it is easier for the structure of disposing the ground member 74 and the counterpart ground member 84 to be realized as a relatively simple structure than such a structure of surrounding the connector device 70 and the counterpart connector device 80 from the outside as the shield member 677 and the counterpart shield member 687 in Comparative Example 2. Specifically, for example, by arranging a plate-like member made of metal between the plurality of first couples 71 and the plurality of second couplers 72, and between the plurality of first counterpart couplers 81 and the plurality of second counterpart couplers 82, it is possible to provide the ground member 74 and the counterpart ground member 84. Thus, it is possible to prevent the structure of the connector device 70 and the structure of the counterpart connector device 80 from being complicated compared to such a structure as in Comparative Example 2. Therefore, it is possible to prevent the manufacturing cost of the circuit board unit 60 from increasing.

Further, according to the present embodiment, the arrangement direction of the plurality of first coupling parts 71e and the arrangement direction of the plurality of second coupling parts 72e are directions the same as each other (the first horizontal direction X). The ground member 74 extends along the arrangement direction. Therefore, it is possible to arrange the ground member 74 along the plurality of first couplers 71 and the plurality of second couplers 72 in good condition. Thus, it is possible to make the return current corresponding to the current flowing through the plurality of first couplers 71 and the return current corresponding to the current flowing through the plurality of second couplers 72 flow through the ground member 74 in good condition. Therefore, it is possible to further reduce the unwanted radiation noise N caused by the current flowing through the couplers. Further, the characteristic impedance design of the plurality of first couplers 71 and the characteristic impedance design of the plurality of second couplers 72 can be made easier.

Further, according to the present embodiment, the ground member 74 is disposed up to the outer side in the arrangement direction with respect to at least one of the first couplers 71 respectively disposed at the both ends in the arrangement direction (the first horizontal direction X) of the coupling parts, and the second couplers 72 respectively disposed at the both ends in the arrangement direction (the first horizontal direction X) of the coupling parts. Therefore, the electromagnetic field generated at the outer side in the arrangement direction from at least one of the couplers disposed at the end in the arrangement direction can be canceled out with the electromagnetic field generated by the return current flowing through the ground member 74. Thus, the unwanted radiation noise N can further be reduced. In the present embodiment, the ground member 74 projects to the outer side in the arrangement direction than any of the couplers disposed at the end in the arrangement direction. Therefore, the unwanted radiation noise N can be reduced in better condition.

Further, according to the present embodiment, the ground member 74 has the ground coupling part 74c which projects from the housing 73 in the coupling direction (the vertical direction Z) in which the connector device 70 and the counterpart connector device 80 are coupled to each other, and is electrically coupled to the counterpart ground member 84. Therefore, it is easy to electrically couple the ground coupling part 74c to the counterpart ground member 84.

Further, according to the present embodiment, the ground member 74 has the board coupling part 74b electrically coupled to the first circuit board main body 63 to which the connector device 70 is attached. The board coupling part 74b projects from the housing 73 in the coupling direction (the vertical direction Z) in which the connector device 70 and the counterpart connector device 80 are coupled to each other. Therefore, it is possible to easily couple the ground member 74 to the first ground layer 63b of the first circuit board main body 63.

Further, according to the present embodiment, the ground member 74 has the main body part 74a to which the board coupling part 74b connects. The board coupling part 74b projects from the main body part 74a in the direction crossing the coupling direction (the vertical direction z) in which the connector device 70 and the counterpart connector device 80 are coupled to each other, and at the same time, the direction (the second horizontal direction Y) different from the arrangement direction (the first horizontal direction X) of the plurality of first coupling parts 71e and the arrangement direction (the first horizontal direction X) of the plurality of second coupling parts 72e. Therefore, it is easy to enlarge the board coupling part 74b in good condition, and it is easy to stably couple the board coupling part 74b to the first circuit board main body 63. Further, it is easy to enlarge the area in which the board coupling part 74b and the first circuit board main body 63 are coupled to each other, and it is easy to ensure the return path through which the return current flows in better condition. Specifically, in the present embodiment, it is easy to increase the number of the through holes 63h for electrically coupling the board coupling part 74b and the first ground layer 63b to each other, and it is possible to increase the number of the coupling places between the board coupling part 74b and the first ground layer 63b. Thus, it is possible to ensure the return path through which the return current flows in better condition.

It should be noted that it is possible to obtain substantially the same advantages as the advantages explained with respect to the connector device 70 described above by a portion having substantially the same structure as that of the connector device 70 out of the counterpart connector device 80.

Second Embodiment

Figure 7:
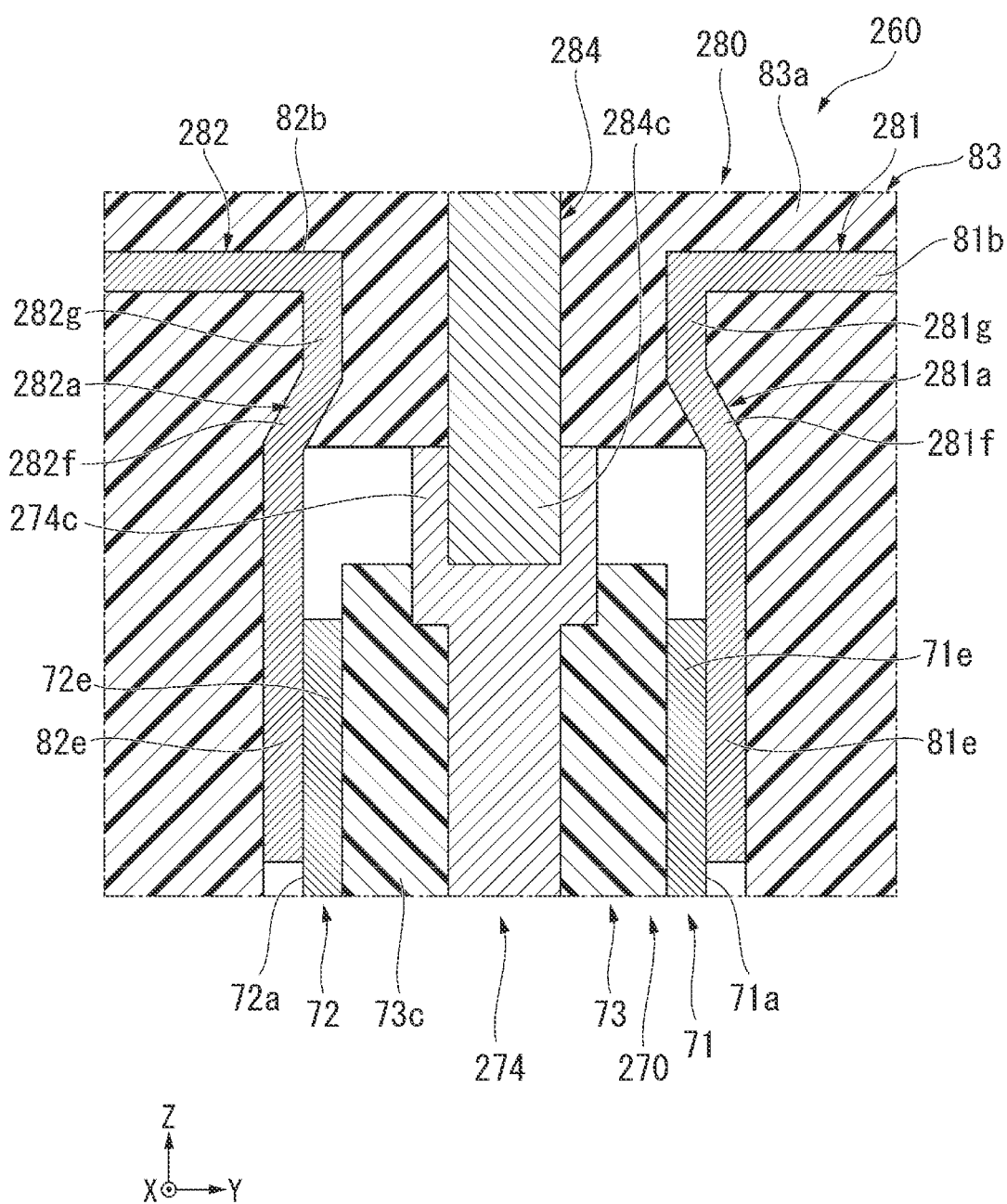
FIG. 7 is a cross-sectional view showing a part of a circuit board unit in a second embodiment.

FIG. 7 is a cross-sectional view showing a part of a circuit board unit 260 according to the present embodiment. In the following description, constituents substantially the same as in the embodiment described above are arbitrarily denoted by the same reference symbols to thereby omit the description thereof in some cases.

As shown in FIG. 7, in the circuit board unit 260 according to the present embodiment, a ground member 274 of a connector device 270 has a ground coupling part (a clamping part) 274c. The ground coupling part 274c is a clamping part for clamping a part of a counterpart ground member 284. More particularly, the ground coupling part 274c clamps the counterpart ground coupling part 284c in the second horizontal direction Y. In the present embodiment, the second horizontal direction Y is a clamping direction. The ground coupling part 274c is shaped like a substantially U-shape opening upward when viewed in the first horizontal direction X. As shown in FIG. 7, in a state in which the housing 73 and the counterpart housing 83 are fitted to each other, the counterpart ground coupling part 284c is fitted into the inside of the ground coupling part 274c from above. The ground coupling part 274c and the counterpart ground coupling part 284c have contact with each other, and are electrically coupled to each other. Thus, the counterpart ground member 284 is electrically coupled to the ground member 274.

In a first counterpart coupler 281 of a counterpart connector device 280, a first extending part 281a has a bend part 281f bending in a direction of coming closer to the counterpart ground member 284 from the first counterpart coupling part 81e. In the present embodiment, the bend part 281f extends from an upper end portion of the first counterpart coupling part 81e upward and obliquely toward the other side (−Y side) in the second horizontal direction. A portion 281g located at an upper side of the bend part 281f out of the first extending part 281a linearly extends upward from the upper end portion of the bend part 281f, and connects to an end portion at the other side in the second horizontal direction of the second extending part 81b. The bend part 281f is embedded in the top wall part 83a. A distance along the second horizontal direction Y between the portion 281g and the counterpart ground member 284 is the same as a distance along the second horizontal direction Y between the first extending part 71a in the first coupler 71 and the ground member 274 in the connector device 270.

In a second counterpart coupler 282 of the counterpart connector device 280, a first extending part 282a has a bend part 282f bending in a direction of coming closer to the counterpart ground member 284 from the second counterpart coupling part 82e. In the present embodiment, the bend part 282f extends from an upper end portion of the second counterpart coupling part 82e upward and obliquely toward the one side (+Y side) in the second horizontal direction. A portion 282g located at an upper side of the bend part 282f out of the first extending part 282a linearly extends upward from the upper end portion of the bend part 282f, and connects to an end portion at the one side in the second horizontal direction of the second extending part 82b. The bend part 282f is embedded in the top wall part 83a. A distance along the second horizontal direction Y between the portion 282g and the counterpart ground member 284 is the same as a distance along the second horizontal direction Y between the first extending part 72a in the second coupler 72 and the ground member 274 in the connector device 270.

The rest of the configuration of the connector device 270 is substantially the same as the rest of the configuration of the connector device 70 in the first embodiment. The rest of the configuration of the counterpart connector device 280 is substantially the same as the rest of the configuration of the counterpart connector device 80 in the first embodiment. The rest of the configuration of the circuit board unit 260 is substantially the same as the rest of the configuration of the circuit board unit 60 in the first embodiment.

According to the present embodiment, the first counterpart coupler 281 has the bend part 281f bending in the direction of coming closer to the counterpart ground member 284 from the first counterpart coupling part 81e. Therefore, even in the configuration in which the first counterpart coupling part 81e is coupled to the first coupling part 71e at a far side (+Y side) from the counterpart ground member 284, it is possible to make a part of the first counterpart coupler 281 closer to the counterpart ground member 284 due to the bend part 281f. Thus, it is possible to, for example, make the distance between the counterpart ground member 284 and the portion 281g of the first counterpart coupler 281 the same as the distance between the ground member 274 and the first extending part 71a of the first coupler 71 as in the present embodiment. Therefore, it is easy to make the distance between the first coupler 71 and the ground member 274 and the distance between the first counterpart coupler 281 and the counterpart ground member 284 substantially the same. Therefore, it is easy to optimize the characteristic impedance of the first coupler 71 and the characteristic impedance of the first counterpart coupler 281. This applies to the second coupler 72 and the second counterpart coupler 282.

Further, according to the present embodiment, the ground member 274 has the ground coupling part 274c as the clamping part for clamping a part of the counterpart ground member 284. Therefore, it is easy to electrically couple the ground member 274 and the counterpart ground member 284 to each other in a stable manner.

It should be noted that the structure having the bend part described in the present embodiment can be provided to the connector device. Specifically, it is possible for the first coupler to have a bend part bending in a direction of coming closer to the ground member from the first coupling part. Regarding this case, there can be obtained substantially the same advantages as the advantages due to the structure having the bend part described above.

Further, the structure of the ground member 274 and the structure of the counterpart ground member 284 can be exchanged for each other. Specifically, it is possible to adopt a configuration in which the clamping part is provided to the counterpart ground member 284.

Third Embodiment

Figure 8:
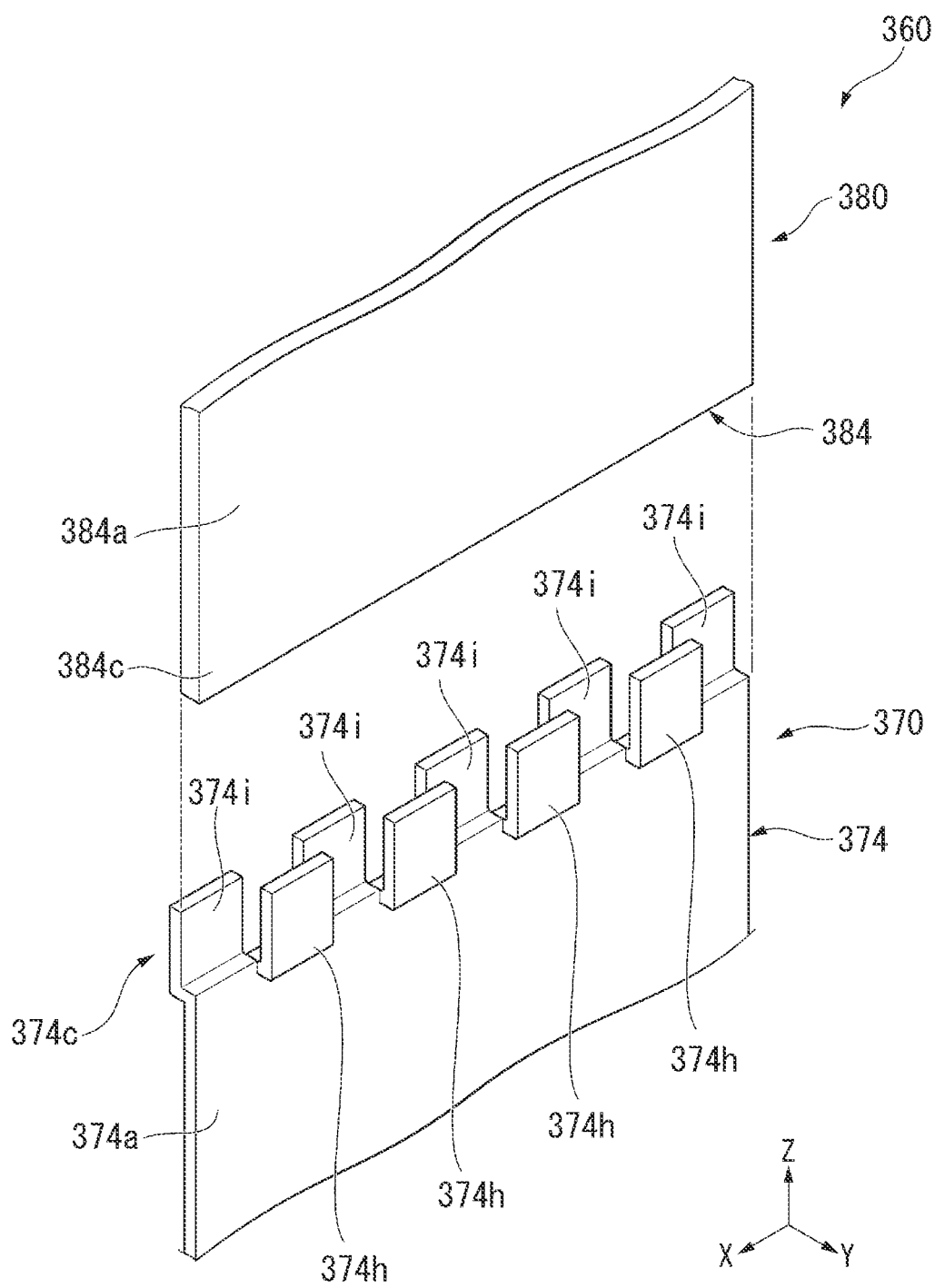
FIG. 8 is a cross-sectional view showing a part of a circuit board unit in a third embodiment.

FIG. 8 is a cross-sectional view showing a part of a circuit board unit 360 according to the present embodiment. In the following description, constituents substantially the same as in the embodiment described above are arbitrarily denoted by the same reference symbols to thereby omit the description thereof in some cases.

In the circuit board unit 360, a ground member 374 of a connector device 370 has a main body part 374a and a ground coupling part (a clamping part) 374c. The main body part 374a is shaped like a rectangular plate having a plate surface facing to the second horizontal direction Y. The ground coupling part 374c is a clamping part for clamping a part of a counterpart ground member 384. In the present embodiment, the ground coupling part 374c has a plurality of first clamping parts 374h and a plurality of second clamping parts 374i. The plurality of first clamping parts 374h and the plurality of second clamping parts 374i connect to an upper end portion of the main body part 374a. In the present embodiment, the plurality of first clamping parts 374h and the plurality of second clamping parts 374i are each shaped like a rectangular plate having a plate surface facing to the second horizontal direction Y. The plurality of first clamping parts 374h and the second clamping parts 374i are alternately arranged along the first horizontal direction X crossing both of a coupling direction (the vertical direction 2) in which the connector device 370 and a counterpart connector device 380 are coupled to each other, and a clamping direction (the second horizontal direction Y) in which the ground coupling part 374c as the clamping part clamps the counterpart ground member 384. Specifically, the plurality of first clamping parts 374h and the plurality of second clamping parts 374i are arranged along at least one of the arrangement directions of the plurality of first coupling parts 71e, the plurality of second coupling parts 72e, the plurality of first counterpart coupling parts 81e, and the plurality of second counterpart coupling parts 82e, and at the same time, arranged so as to be shifted in the arrangement direction from each other when viewed from the second horizontal direction Y. The plurality of first clamping parts 374h and the plurality of second clamping parts 374i can be configured so as to partially overlap each other, or can be configured so as not to partially overlap each other when viewed from the second horizontal direction Y.

The plurality of first clamping parts 374h is located at the one side (+Y side) in the second horizontal direction of the main body part 374a. The plurality of second clamping parts 374i is located at the other side (−Y side) in the second horizontal direction of the main body part 374a. Specifically, the plurality of first clamping parts 374h and the plurality of second clamping parts 374i are arranged at a distance in the second horizontal direction Y from each other. By the counterpart ground coupling part 384c disposed in the lower end portion of the counterpart main body part 384a of the counterpart ground member 384 being inserted from above between the plurality of first clamping parts 374h and the plurality of second clamping parts 374i in the second horizontal direction Y, the ground member 374 and the counterpart ground member 384 are electrically coupled to each other. A distance along the second horizontal direction Y between the first clamping part 374*h* and the second clamping part 374*i* is designed in accordance with a dimension along the second horizontal direction Y of the counterpart ground coupling part 384*c*.

The plurality of first clamping parts 374*h* and the plurality of second clamping parts 374*i* are manufactured by, for example, dividing the upper end portion of the main body part 374*a* in the first horizontal direction X with cuts or the like, and then folding the divisional portions in the second horizontal direction Y in a staggered manner.

The rest of the configuration of the connector device 370 is substantially the same as the rest of the configuration of the connector device 70 in the first embodiment. The rest of the configuration of the counterpart connector device 380 is substantially the same as the rest of the configuration of the counterpart connector device 80 in the first embodiment. The rest of the configuration of the circuit board unit 360 is substantially the same as the rest of the configuration of the circuit board unit 60 in the first embodiment.

According to the present embodiment, the ground coupling part 374*c* as the clamping part has the plurality of first clamping parts 374*h* and the plurality of second clamping parts 374*i* alternately arranged along the direction crossing both of the coupling direction in which the connector device 370 and the counterpart connector device 380 are coupled to each other and the clamping direction in which the ground coupling part 374*c* as the clamping part clamps the counterpart ground member 384. The plurality of first clamping parts 374*h* and the plurality of second clamping parts 374*i* are arranged at a distance in the clamping direction (the second horizontal direction Y) from each other. Therefore, it is possible to stably clamp the counterpart ground member 384 with the plurality of first clamping parts 374*h* and the plurality of second clamping parts 374*i*. Further, as described above, since it is possible to manufacture the plurality of first clamping parts 374*h* and the plurality of second clamping parts 374*i* by dividing the upper end portion of the main body part 374*a* as described above, it is possible to provide the plurality of first clamping parts 374*h* and the plurality of second clamping parts 374*i* while reducing the number of components.

It should be noted that it is possible to provide a protrusion protruding toward the counterpart ground member 384 to at least a part of the plurality of first clamping parts 374*h* and the plurality of second clamping parts 374*i*. In this case, it is possible to make the plurality of first clamping parts 374*h* and the plurality of second clamping parts 374*i* have contact with the counterpart ground member 384 in better condition. The protrusion can be provided to the counterpart ground member 384.

Further, the plurality of first clamping parts 374*h* and the plurality of second clamping parts 374*i* can be provided to the counterpart ground member 384. In this case, for example, the ground coupling part 374*c* can be made substantially the same in shape as the counterpart ground coupling part 384*c* shown in FIG. 8.

It should be noted that in the present embodiment, it is sufficient for the ground member 374 to have at least one first clamping part and at least one second clamping part. For example, it is possible to adopt a configuration in which the ground member has one first clamping part and one second clamping part, the first clamping part extends in the first horizontal direction X from an end portion at the one side (+X side) in the first horizontal direction in the ground coupling part toward the other side (−X side) in the first horizontal direction to an intermediate position, and the second clamping part extends in the first horizontal direction X from the intermediate position to an end portion at the other side (−X side) in the first horizontal direction X in the ground coupling part. Further, for example, it is possible to adopt a configuration in which the ground member has two first clamping parts and one second clamping part, and the two first clamping parts and the one second clamping part are arranged alternately along the first horizontal direction X.

Fourth Embodiment

Figure 9:
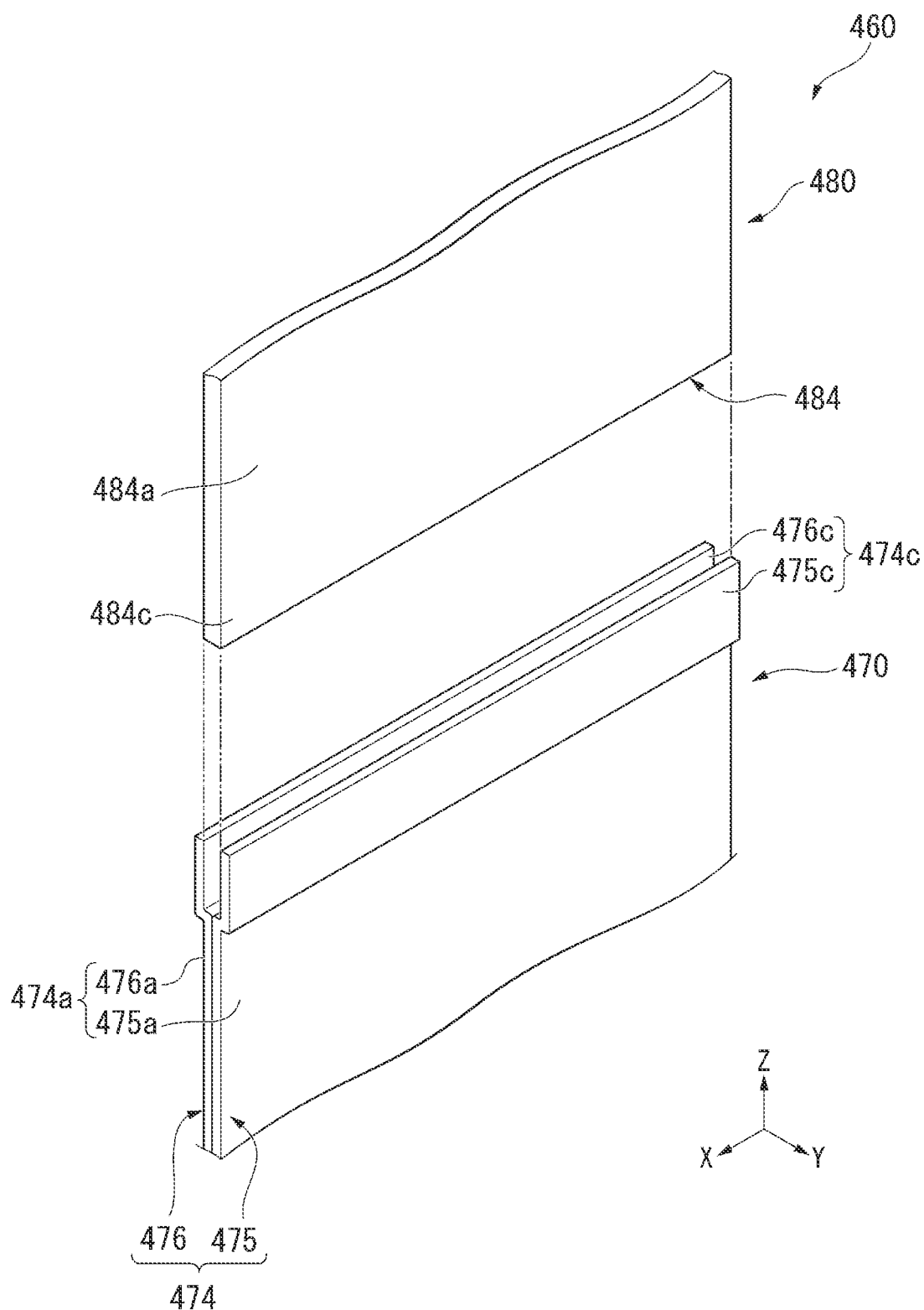
FIG. 9 is a cross-sectional view showing a part of a circuit board unit in a fourth embodiment.

FIG. 9 is a cross-sectional view showing a part of a circuit board unit 460 according to the present embodiment. In the following description, constituents substantially the same as in the embodiment described above are arbitrarily denoted by the same reference symbols to thereby omit the description thereof in some cases.

In the circuit board unit 460, a ground member 474 of a connector device 470 has a first member 475 and a second member 476 as a separate body from the first member 475. The first member 475 and the second member 476 are stacked on one another in the second horizontal direction Y to constitute the ground member 474. The second member 476 is located at the other side (−Y side) in the second horizontal direction of the first member 475.

The first member 475 has a first member main body 475*a* and a first clamping part 475*c*. The second member 476 has a second member main body 476*a* and a second clamping part 476*c*. The first member main body 475*a* and the second member main body 476*a* are each shaped like a rectangular plate having a plate surface facing to the second horizontal direction Y. The first member main body 475*a* and the second member main body 476*a* are stacked on one another in the second horizontal direction Y to constitute a main body part 474*a* of the ground member 474.

The first clamping part 475*c* and the second clamping part 476*c* constitute a ground coupling part (a clamping part) 474*c* of the ground member 474. The ground coupling part 474*c* is the clamping part for clamping a part of a counterpart ground member 484. The first clamping part 475*c* is disposed in an upper end portion of the first member main body 475*a*. The second clamping part 476*c* is disposed in an upper end portion of the second member main body 476*a*. The first clamping part 475*c* is located at the one side (+Y side) in the second horizontal direction of the first member main body 475*a*. The second clamping part 476*c* is located at the other side (−Y side) in the second horizontal direction of the second member main body 476*a*. The first clamping part 475*c* and the second clamping part 476*c* are arranged at a distance from each other in a clamping direction (the second horizontal direction Y) in which the ground coupling part 474*c* as the clamping part clamps the counterpart ground member 484. The first clamping part 475*c* is formed by, for example, folding an upper end portion of the first member main body 475*a* toward the one side in the second horizontal direction. The second clamping part 476*c* is formed by, for example, folding an upper end portion of the second member main body 476*a* toward the other side in the second horizontal direction.

By a counterpart ground coupling part 484*c* disposed in a lower end portion of the counterpart main body part 484*a* of the counterpart ground member 484 being inserted from above between the first clamping part 475*c* and the second clamping part 476*c* in the second horizontal direction Y, the ground member 474 and the counterpart ground member 484 are electrically coupled to each other. A distance along the second horizontal direction Y between the first clamping part 475c and the second clamping part 476c is designed in accordance with a dimension along the second horizontal direction Y of the counterpart ground coupling part 484c. In the present embodiment, the counterpart ground member 484 is substantially the same in shape as the counterpart ground member 384 in the third embodiment.

The rest of the configuration of the connector device 470 is substantially the same as the rest of the configuration of the connector device 70 in the first embodiment. The rest of the configuration of the counterpart connector device 480 is substantially the same as the rest of the configuration of the counterpart connector device 80 in the first embodiment. The rest of the configuration of the circuit board unit 460 is substantially the same as the rest of the configuration of the circuit board unit 60 in the first embodiment.

According to the present embodiment, the ground coupling part 474c as the clamping part has the first clamping part 475c and the second clamping part 476c arranged at a distance from each other in the clamping direction (the second horizontal direction Y) in which the ground coupling part 474c as the clamping part clamps the counterpart ground member 484. The ground member 474 has the first member 475 having the first clamping part 475c, and the second member 476 which is a separate body from the first member 475, and has the second clamping part 476c. By forming the ground member 474 using the two members, and providing the first clamping part 475c and the second clamping part 476c to the respective members as described above, it is possible to easily manufacture the clamping part for clamping the counterpart ground member 484.

It should be noted that it is possible to provide a protrusion protruding toward the counterpart ground member 484 to at least one of the first clamping part 475c and the second clamping part 476c. In this case, it is possible to make the first clamping part 475c and the second clamping part 475c have contact with the counterpart ground member 484 in better condition. The protrusion can be provided to the counterpart ground member 484.

Further, the structure of the ground member 474 and the structure of the counterpart ground member 484 can be exchanged for each other. Specifically, it is possible for the counterpart ground member 484 to be constituted by the first member having the first clamping part and the second member having the second clamping part.

The embodiment of the present disclosure is not limited to the embodiments described above, and it is possible to adopt the following configurations and methods. The ground member can be provided with any arrangement and any shape providing the ground member is arranged between the plurality of first couplers and the plurality of second couplers. This also applies to the counterpart ground member. Any shapes can be adopted as the shape of a portion in which the ground member and the counterpart ground member are coupled to each other. It is possible to provide a plurality of the ground members. It is possible to provide a plurality of the counterpart ground members.

Further, in the connector structure 90 in the first embodiment described above, there is adopted the structure in which the end portion at an upper side (+Z side) in the vertical direction in the ground coupling part 74c of the ground member 74, and the end portion at a lower side (−Z side) in the vertical direction in the counterpart ground coupling part 84c in the counterpart ground member 84 make contact with each other when the connector device 70 and the counterpart connector device 80 are fitted in each other, but this is not a limitation. It is possible to adopt a structure in which, for example, an end portion at the one side (+Y side) in the second horizontal direction in the ground coupling part and an end portion at the other side (−Y side) in the second horizontal direction in the counterpart ground coupling part have contact with each other to electrically be coupled to each other.

The shape of the first coupler, the shape of the second coupler, the shape of the first counterpart coupler, and the shape of the second counterpart coupler are not particularly limited. For example, the first extending part 71a of the first coupler 71 and the first extending part 72a of the second coupler 72 held by the connector device 70 are configured to have a linear shape when viewed from the first horizontal direction X in the first embodiment described above, but the first extending part of each of the first coupler and the second coupler can be bent or curved. In this case, it is possible to adopt a configuration in which, for example, a part of each of the first extending parts is arranged inside the housing, and the first coupling part and the second coupling part in each of the first extending parts are exposed from the housing. Similarly, it is possible for the first extending part of the first counterpart coupler and the first extending part of the second counterpart coupler held by the counterpart connector device to be bent or curved.

Further, the number of the first couplers, the number of the second couplers, the number of the first counterpart couplers, and the number of the second counterpart couplers are not particularly limited. The arrangement direction in which the first coupling parts of the plurality of first couplers are arranged, and the arrangement direction in which the second coupling parts of the plurality of second couplers are arranged can be different from each other. The arrangement direction in which the first counterpart coupling parts of the plurality of first counterpart couplers are arranged, and the arrangement direction in which the second counterpart coupling parts of the plurality of second counterpart couplers are arranged can be different from each other.

Further, the ground coupling part 74c of the ground member 74 and the counterpart ground coupling parts 84c of the counterpart ground member 84 are each have a columnar shape viewed from the first horizontal direction X in the first embodiment described above, but one of the ground coupling part 74c and the counterpart ground coupling part 84c can be the clamping part in the second through fourth embodiments described above.

The connector device according to the present disclosure is a connector device to electrically be coupled to a counterpart connector device, the connector device having a configuration including a housing, a first coupler which is held by the housing, and has a first coupling part to electrically be coupled to a first counterpart coupler provided to the counterpart connector device, and a ground member which is held by the housing, and is electrically coupled to a counterpart ground member provided to the counterpart connector device, wherein the housing has a protruding part protruding in a coupling direction in which the connector device and the counterpart connector device are coupled to each other, the ground member is held by the protruding part, and the first coupling part is disposed at one side of the protruding part in a direction crossing the coupling direction. Also in this configuration, similarly to the embodiments described above, the unwanted radiation noise can be suppressed. The protruding part in this configuration is, for example, the protruding part 73c in the embodiments described above. In the case of this configuration, the second coupler is not required to be provided.

Further, the connector device according to the present disclosure is a connector device to electrically be coupled to a counterpart connector device, the connector device having a configuration including a housing, a first coupler which is held by the housing, and has a first coupling part to electrically be coupled to a first counterpart coupler provided to the counterpart connector device, and a ground member which is held by the housing, and is electrically coupled to a counterpart ground member provided to the counterpart connector device, wherein the housing has a recessed part recessed in a coupling direction in which the connector device and the counterpart connector device are coupled to each other, the ground member is held by a bottom part of the recessed part, and the first coupling part is arranged along an inner side surface of the recessed part. The recessed part in this configuration is, for example, the recessed part 83f in the embodiments described above. In the case of this configuration, the second coupler is not required to be provided.

The configurations described as the "connector device" in the explanation described above can all be adopted as a configuration of the "counterpart connector device." Further, the configurations described as the "counterpart connector device" in the explanation described above can all be adopted as a configuration of the "connector device." Further, it is possible to adopt a configuration in which the connector device is an internal connector, and the counterpart connector device is an external connector.

Further, although in the first embodiment described above, there is described the example when the present disclosure is applied to a transmissive projector, the present disclosure can also be applied to a reflective projector. Here, "transmissive" means that the liquid crystal light valve including the liquid crystal panel and so on is a type of transmitting light. Further, "reflective" means that the liquid crystal light valve is a type of reflecting the light. It should be noted that the light modulation device is not limited to the liquid crystal panel or the like, and can also be a light modulation device using, for example, micro-mirrors.

Further, although there is cited the example of the projector 1 using the three light modulation devices 4R, 4G, and 4B in the first embodiment described above, the present disclosure can also be applied to a projector using one light modulation device alone or a projector using four or more light modulation devices.

Further, the electronic apparatus equipped with the circuit board and the electronic apparatus equipped with the circuit board unit are not limited to the projector, and can also be other electronic apparatuses.

Further, the configurations described in the present specification can arbitrarily be combined with each other within a range in which the configurations do not conflict with each other.

What is claimed is:

1. A connector device to electrically be coupled to a counterpart connector device, the connector device comprising:
   a housing,
   a plurality of first couplers held by the housing, each first coupler having a first coupling part to electrically be coupled to a first counterpart coupler provided to the counterpart connector device; and
   a plurality of second couplers held by the housing, each second coupler having a second coupling part to electrically be coupled to a second counterpart coupler provided to the counterpart connector device; and
   a ground member held by the housing and electrically coupled to a counterpart ground member provided to the counterpart connector device, wherein
   the first coupling parts of the plurality of first couplers are arranged side by side so as to be exposed from the housing along a first surface,
   the second coupling parts of the plurality of second couplers are arranged side by side so as to be exposed from the housing along a second surface different from the first surface, and
   the ground member is arranged between the plurality of first couplers and the plurality of second couplers, and is arranged along a coupling direction in which the connector device and the counterpart connector device are coupled to each other,
   wherein the ground member has a ground coupling part projecting from a volume defining the housing in the coupling direction and electrically coupled to the counterpart ground member at least partially by a surface of the ground coupling part facing the coupling direction.

2. The connector device according to claim 1, wherein
an arrangement direction of the plurality of first coupling parts and an arrangement direction of the plurality of second coupling parts are same as each other, and
the ground member extends along the arrangement direction.

3. The connector device according to claim 2, wherein
the ground member is disposed up to an outer side in the arrangement direction with respect to at least one of four couplers, and
the four couplers are one-end first coupler and another-end first coupler out of the first couplers respectively disposed at both ends in the arrangement direction, and one-end second coupler and another-end second coupler out of the second couplers respectively disposed at both ends in the arrangement direction.

4. The connector device according to claim 1, wherein
the ground member has a board coupling part electrically coupled to a circuit board main body to which the connector device is attached, and
the board coupling part projects from the housing in the coupling direction.

5. The connector device according to claim 4, wherein
the ground member has a main body part to which the board coupling part connects, and
the board coupling part projects from the main body part in a direction which intersects the coupling direction, the direction being different from both an arrangement direction of the plurality of first coupling parts and an arrangement direction of the plurality of second coupling parts.

6. The connector device according to claim 1, wherein
each first coupler of the plurality of first couplers has a bend part bending in a direction of coming closer to the ground member from the first coupling part.

7. The connector device according to claim 1, wherein
the ground member has a clamping part configured to clamp a part of the counterpart ground member.

8. The connector device according to claim 7, wherein
the clamping part has a first clamping part and a second clamping part which are arranged along a direction intersecting both of the coupling direction and a clamping direction in which the clamping part clamps the counterpart ground member, and
the first clamping part and the second clamping part are arranged at a distance in the clamping direction.

9. The connector device according to claim 7, wherein
the clamping part has a first clamping part and a second clamping part which are separated from each other in a clamping direction in which the clamping part clamps the counterpart ground member, and
the ground member includes
a first member having the first clamping part, and
a second member having the second clamping part, the second member being a separate body from the first member.

10. A circuit board comprising:
the connector device according to claim 1; and
a circuit board main body on which the connector device is arranged.

11. An electronic apparatus comprising:
the circuit board according to claim 10.

12. The connector device according to claim 1, wherein each of the first couplers comprises
a first extending part extending in the coupling direction, and
a second extending part extending in a direction intersecting the coupling direction from an end of the first extending part opposite to a side where the counterpart connector device is located, wherein the first extending part comprises:
a first coupling part, and
a bend part bending in a direction approaching the ground member from the first coupling part,
wherein the bend part is provided in a portion of the first extending part located between the end of the first extending part coupled to the second extending part and the first coupling part.

13. A circuit board unit comprising:
a first circuit board main body having a first ground layer;
a second circuit board main body having a second ground layer; and
a connector structure configured to couple the first circuit board main body and the second circuit board main body to each other, the connector structure being configured to relay signal transmission between the first circuit board main body and the second circuit board main body, wherein
the connector structure includes
a connector device arranged on the first circuit board main body, and
a counterpart connector device arranged on the second circuit board main body and coupled to the connector device,
the connector device includes
a housing,
a plurality of first couplers held by the housing, each first coupler having a first coupling part,
a plurality of second couplers held by the housing, each second coupler having a second coupling part, and
a ground member held by the housing,
the first coupling parts of the plurality of first couplers are arranged side by side so as to be exposed from the housing along a first surface,
the second coupling parts of the plurality of second couplers are arranged side by side so as to be exposed from the housing along a second surface different from the first surface,
the counterpart connector device includes
a counterpart housing,
a plurality of first counterpart couplers held by the counterpart housing, each first counterpart coupler having a first counterpart coupling part electrically coupled to the first coupling part,
a plurality of second counterpart couplers held by the counterpart housing, each second counterpart coupler having a second counterpart coupling part electrically coupled to the second coupling part, and
a counterpart ground member held by the counterpart housing and electrically coupled to the ground member,
the first counterpart coupling parts of the plurality of first counterpart couplers are arranged side by side so as to be exposed from the housing along a third surface,
the second counterpart coupling parts of the plurality of second counterpart couplers are arranged side by side so as to be exposed from the housing along a fourth surface different from the third surface,
the ground member is electrically coupled to the first ground layer, is arranged between the plurality of first couplers and the plurality of second couplers, and is arranged along a coupling direction in which the connector device and the counterpart connector device are coupled to each other, and
the counterpart ground member is electrically coupled to the second ground layer, is arranged between the plurality of first counterpart couplers and the plurality of second counterpart couplers, and is arranged along the coupling direction,
wherein the ground member has a ground coupling part projecting from a volume defined by the housing in the coupling direction and electrically coupled to the counterpart ground member at least partially by a surface of the ground coupling part facing the coupling direction.

14. The circuit board unit according to claim 13, wherein
an arrangement direction of the plurality of first coupling parts and an arrangement direction of the plurality of second coupling parts are same as each other, and
the ground member extends along the arrangement direction.

15. The circuit board unit according to claim 14, wherein
the ground member is disposed up to an outer side in the arrangement direction with respect to at least one of four couplers, and
the four couplers are one-end first coupler and another-end first coupler out of the first couplers respectively disposed at both ends in the arrangement direction, and one-end second coupler and another-end second coupler out of the second couplers respectively disposed at both ends in the arrangement direction.

16. The circuit board unit according to claim 13, wherein
the ground member has a board coupling part electrically coupled to the first ground layer, and
the board coupling part projects from the housing in the coupling direction.

17. The circuit board unit according to claim 16, wherein
the ground member has a main body part to which the board coupling part connects, and
the board coupling part projects from the main body part in a direction which intersects the coupling direction, the direction being different from both an arrangement direction of the plurality of first coupling parts and an arrangement direction of the plurality of second coupling parts.

18. The circuit board unit according to claim 13, wherein
each first coupler of the plurality of first couplers has a bend part bending in a direction of coming closer to the ground member from the first coupling part.

19. An electronic apparatus comprising:
the circuit board unit according to claim 13.

20. The circuit board unit according to claim 13, wherein
each of the first couplers comprises a first extending part extending in the coupling direction, and a second extending part extending in a direction intersecting the coupling direction from an end of the first extending part opposite to a side where the counterpart connector device is located, wherein the first extending part comprises:

a first coupling part, and a bend part bending in a direction approaching the ground member from the first coupling part, wherein the bend part is provided in a portion of the first extending part located between the end of the first extending part coupled to the second extending part and the first coupling part.

* * * * *